United States Patent
Lee et al.

(10) Patent No.: US 9,437,290 B2
(45) Date of Patent: Sep. 6, 2016

(54) RESISTIVE MEMORY DEVICE AND OPERATION

(71) Applicant: SAMSUNG ELECTRONICS CO., LTD., Suwon-Si, Gyeonggi-Do (KR)

(72) Inventors: Yong-Kyu Lee, Hwaseong-Si (KR); Dae-Seok Byeon, Seongnam-Si (KR); Hyo-Jin Kwon, Seoul (KR); Hyun-Kook Park, Anyang-Si (KR); Chi-Weon Yoon, Seoul (KR); Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/631,182

(22) Filed: Feb. 25, 2015

(65) Prior Publication Data

US 2016/0027508 A1    Jan. 28, 2016

(30) Foreign Application Priority Data

Jul. 22, 2014  (KR) ........................ 10-2014-0092660

(51) Int. Cl.
*G11C 11/00* (2006.01)
*G11C 13/00* (2006.01)
*G11C 11/56* (2006.01)

(52) U.S. Cl.
CPC ........ *G11C 13/0033* (2013.01); *G11C 11/5607* (2013.01); *G11C 11/5678* (2013.01); *G11C 11/5685* (2013.01); *G11C 13/0004* (2013.01); *G11C 13/0007* (2013.01)

(58) Field of Classification Search
CPC ............ G11C 13/0069; G11C 13/004; G11C 13/0004; G11C 13/0033; G11C 16/3431; G11C 13/0007; G11C 2213/72; G11C 11/005; G11C 2013/009; G11C 13/0064; G11C 2013/0054; G11C 2013/0078; G11C 2213/71
USPC ............ 365/148, 222, 230.03, 189.011, 207, 365/185.23, 189.16, 158, 171, 210.12, 220
See application file for complete search history.

(56) References Cited

U.S. PATENT DOCUMENTS

| | | | |
|---|---|---|---|
| 7,679,980 B2 | 3/2010 | Happ et al. | |
| 7,843,741 B2 | 11/2010 | Jeong et al. | |
| 8,259,488 B1 | 9/2012 | Tedrow et al. | |
| 8,654,559 B2 | 2/2014 | Nakano et al. | |
| 2007/0279975 A1 | 12/2007 | Hudgens | |
| 2011/0193043 A1 | 8/2011 | Chin | |
| 2013/0229850 A1 | 9/2013 | Kaneko et al. | |
| 2013/0336048 A1* | 12/2013 | Hokenmaier | G11C 13/0004 365/163 |
| 2014/0056052 A1 | 2/2014 | Lee | |

FOREIGN PATENT DOCUMENTS

| | | |
|---|---|---|
| JP | 2004303382 A | 10/2004 |
| JP | 2010015639 A | 1/2010 |
| KR | 1020090068817 A | 6/2009 |

* cited by examiner

*Primary Examiner* — Thong Q Le
(74) *Attorney, Agent, or Firm* — Volentine & Whitt, PLLC

(57) ABSTRACT

A method of operating a resistive memory device including a plurality of memory cells comprises determining whether to perform a refresh operation on memory cells in a memory cell array; determining a resistance state of each of at least some of the memory cells; and performing a re-writing operation on a first memory cell having a resistance state from among a plurality of resistance states that is equal to or less than a critical resistance level.

19 Claims, 19 Drawing Sheets

RESISTIVE MEMORY DEVICE AND OPERATION

CROSS-REFERENCE TO RELATED APPLICATIONS

This application claims the benefit of Korean Patent Application No. 10-2014-0092660, filed on Jul. 22, 2014, in the Korean Intellectual Property Office, the disclosure of which is incorporated herein in its entirety by reference.

BACKGROUND

The inventive concept relates to a memory device, and more particularly, to a resistive memory device and a method of operating the same.

Research into next-generation memory devices that are non-volatile and do not require a refresh operation is driven by a demand for high capacity and low power consumption memory devices. Next-generation memory devices should ideally have the high integrity characteristic of dynamic random access memory (DRAM), the non-volatility of flash memories, and the high speed of a static RAM (SRAM). Examples of next-generation memory devices include phase change RAM (PRAM), nano floating gate memory (NFGM), polymer RAM (PoRAM), magnetic RAM (MRAM), ferroelectric RAM (FeRAM), and resistive RAM (RRAM).

SUMMARY

According to an aspect of the inventive concept, a method of operating a resistive memory device comprises determining whether to perform a refresh operation on memory cells in a memory cell array, determining a respective resistance state of each of the memory cells, and performing a re-writing operation on a first memory cell of the memory cells that has a resistance state from among a plurality of resistance states that is equal to or less than a critical resistance level.

The performing of the re-writing operation may include performing a set writing operation on the first memory cell.

The performing of the re-writing operation may include applying a current pulse to the first memory cell.

The first memory cell may include a memory cell having a resistance state other than an uppermost resistance state from among the plurality of resistance states.

The method may further include performing a pre-reading operation on some of the memory cells.

The method may further include classifying the memory cells as the first memory cell and a second memory cell having a resistance state that is greater than the critical resistance level.

The first memory cell may include a memory cell to which data is written through a set writing operation, and the second memory cell may include a memory cell to which the data is written through a reset writing operation.

When the data is written in the memory cells, a bias voltage may be applied to the first memory cell so that a filament is generated in a variable resistance device in the first memory, and a bias voltage may be applied to the second memory cell so that a filament in a variable resistance device is cut.

The determining of whether to perform the refresh operation may include determining to perform the refresh operation when a first reference time that is set in advance has passed after writing the data in the memory cells.

The determining of whether to perform the refresh operation may include increasing a counting value representing a number of reading operations when receiving a read command, determining whether the counting value has reached a first reference value, and determining to perform the refresh operation if the counting value reaches the first reference value.

The determining of whether to perform the refresh operation may include: reading data written in the memory cells; performing error detection with respect to the read data; and determining whether a number of detected errors in the read data exceeds a second reference value that is set in advance, wherein if the number of detected errors exceeds the second reference value, it is determined to perform the refresh operation.

The memory cell array may include a plurality of cell regions, and the performing of the re-writing operation may be performed by a cell region unit.

According to another aspect of the inventive concept, a method is provided for operating a resistive memory device that includes a plurality of memory cells. Each of the memory cells has a respective resistance state that is one of a plurality of resistance states. These resistance states may include a first and second groups of one or more resistance states. The first group of resistance states includes resistance states of higher resistance level than the resistance levels of the second group of resistance states. The method comprises reading the resistance states of the plurality of memory cells and re-writing the read resistance states to the plurality of memory cells. The frequency of performing the re-writing on those of the memory cells having resistance states of the first group of resistance states is less than frequency of performing the re-writing on those of the memory cells having resistance states of the second group of resistance states.

The plurality of resistance states may include a first resistance state and a second resistance state having a resistance level that is lower than a resistance level of the first resistance state, and the re-writing may be performed on a memory cell having the second resistance state between the first and second resistance states.

The re-writing may be not performed on a memory cell having an uppermost resistance state of the plurality of resistance states.

In yet another aspect of the inventive concept, a memory system includes a resistive memory device comprising a memory cell array, a write/read circuit, and control logic circuitry. The memory system is configured to determine whether to perform a refresh operation on memory cells in the memory cell array, to determine a respective resistance state of each of the memory cells, and to perform a re-writing operation on a first memory cell of the memory cells that has a resistance state from among a plurality of resistance states that is equal to or less than a critical resistance level.

BRIEF DESCRIPTION OF THE DRAWINGS

Exemplary embodiments of the inventive concept will be more clearly understood from the following detailed description taken in conjunction with the accompanying drawings, in which.

DETAILED DESCRIPTION OF EMBODIMENTS

Figure 1:
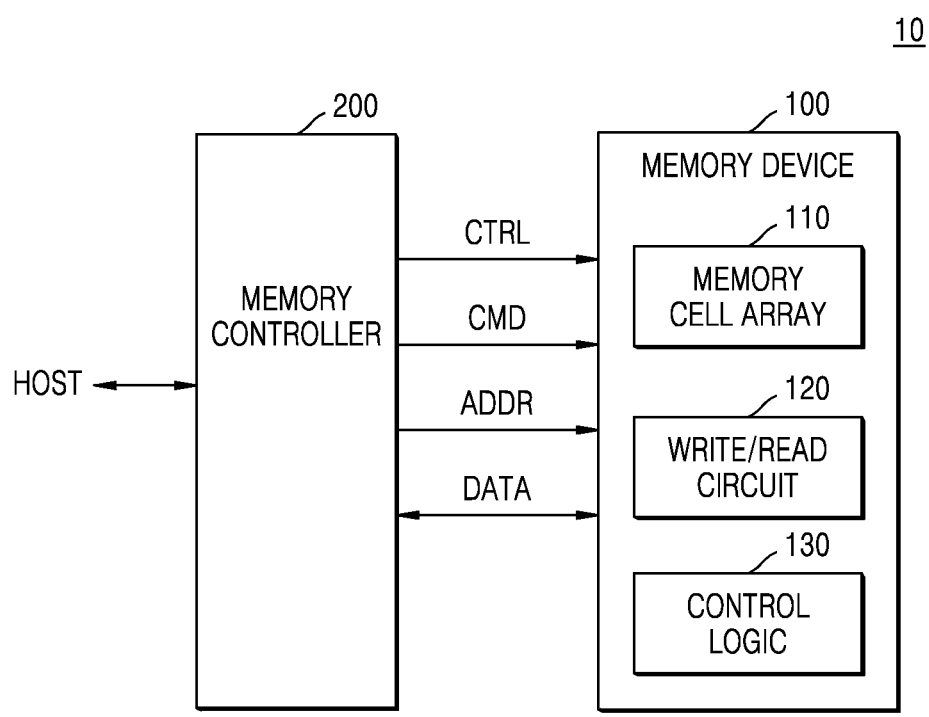
FIG. 1 is a schematic block diagram of a memory system including a resistive memory device according to an exemplary embodiment.

The inventive concept will now be described more fully with reference to the accompanying drawings in which exemplary embodiments of the inventive concept are shown. The inventive concept may, however, be embodied in many different forms, and should not be construed as being limited to the exemplary embodiments set forth herein. Thus, the inventive concept may include all revisions, equivalents, or substitutions which are included in the concept and the technical scope related to the inventive concept. Like reference numerals in the drawings denote like elements. In the drawings, the dimension of structures may be exaggerated for clarity.

Furthermore, all examples and conditional language recited herein are to be construed as being not limited to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

Referring to FIG. 1, the memory system 10 may include a resistive memory device 100 and a memory controller 200. The memory device 100 may include a memory cell array 110, a write/read circuit 120, and control logic 130, and may include circuits for performing writing/reading operations on the memory cell array 110 as controlled by the control logic 130. Since the memory cell array 110 includes resistive memory cells, the memory system 10 may be called a resistive memory system.

In response to a write/read request from a host, the memory controller 200 may read data stored in the memory device 100 or may control the memory device 100 to write data to the memory device 100. In more detail, the memory controller 200 may provide an address ADDR, a command CMD, and a control signal CTRL to the memory device 100, and thus may control a program (or write) operation, a reading operation, and/or an erase operation with respect to the memory device 100. Also, data DATA to be written and/or read may be exchanged between the memory controller 200 and the memory device 100.

Although not illustrated, the memory controller 200 may include a Random Access Memory (RAM), a processing unit, a host interface, and/or a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) by using at least one of various interface protocols including Universal Serial Bus (USB), MultiMediaCard (MMC), Peripheral Component Interconnect Express (PCI-E), Advanced Technology Attachment (ATA), Serial-ATA, Parallel-ATA, Small Computer System Interface (SCSI), Earth Science Data Interface (ESDI), and/or Integrated Drive Electronics (IDE).

The memory cell array 110 may include a plurality of memory cells (not shown) that are disposed respectively in regions where a plurality of first signal lines and a plurality of second signal lines cross each other. In this exemplary embodiment the plurality of first and second signal lines may be bit lines and word lines, respectively, while in other embodiments they may be word lines and bit lines respectively.

Each of the plurality of memory cells may be a single level cell (SLC) that stores one bit data, or may be a multilevel cell (MLC) that may store at least two-bit data. Alternatively, the memory cell array 110 may include both SLC and MLC. When one bit data is written to one memory cell, the memory cells may have two resistance level distributions in accordance with the written data. Alternatively, when two-bit data is written to one memory cell, the memory cells may have four resistance level distributions in accordance with the written data. In another exemplary embodiments, if a memory cell is a triple level cell (TLC) that stores three-bit data, the memory cells may have eight resistance level distributions according to the written data. However, embodiments of the inventive concept are not limited thereto. For example, in other embodiments each of the memory cells may store at least four-bit data.

In some embodiments the memory cell array 110 may include memory cells with a two-dimensional (2D) horizontal structure. In other possible embodiments the memory cell array 110 may include memory cells with a three-dimensional (3D) vertical structure.

In an exemplary embodiment, the memory cell array 110 may include a plurality of cell regions that may be defined in various ways. For example, the cell region may be a page including a plurality of memory cells connected to the same word line. As another example, the cell region may include a plurality of memory cells connected to the word lines and the bit lines. As yet another example, the word lines may be connected to one row decoder (or a row selection block) and the bit lines may be connected to one column decoder (or a column selection block), and the above-described cell region may be defined as a tile.

The memory cell array 110 may include resistance-type memory cells or resistive memory cells that include a variable resistor device (not shown). For example, when resistance of the variable resistor device that is formed of a phase change material (e.g., Ge—Sb—Te) is changed with temperature, a resistive memory device may be a phase change RAM (PRAM). As another example, when the variable resistor device is formed of complex metal oxide including an upper electrode, a lower electrode, and transition metal oxide therebetween, the resistive memory device may be a resistive RAM (RRAM). As yet another example, when the variable resistor device is formed with an upper electrode of a magnetic material, a lower electrode of the magnetic material, and a dielectric therebetween, the resistive memory device may be a magnetic RAM (MRAM). For the sake of the following discussion, it will be assumed that the memory cell array 110 is an RRAM.

The write/read circuit 120 performs writing/reading operations on the memory cells. The write/read circuit 120 may be connected to the memory cells via the bit lines, and may include a write driver that writes data to the memory cells and a sense amplifier that amplifies data read from the memory cells.

The control logic 130 may generally control the operations of the memory device 100. Also, in order to ensure the reliability of data stored in the memory cell, the control logic 130 may control a data refresh operation with respect to the memory cell array 110.

When a predetermined time has elapsed or repeated stress has been applied to the memory cell after writing data in the memory cell, resistance level of the memory cell may be changed, so that an incorrect value may be read when reading data from the memory cell. The control logic 130 of the memory device 100 in this exemplary embodiment may re-write data in the memory cell to refresh the data in the memory cell, in order to prevent a data error caused by the changed resistance level of the memory cell. Here, the control logic 130 may determine the memory cell that is to be refreshed from among the plurality of memory cells included in the memory cell array 110, and may control timing of performing the refresh in the memory cell.

According to one or more exemplary embodiments, the control logic 130 may determine data retention characteristics of the memory cells based on resistance state or write state of the memory cells in which the data is written, and may perform re-writing operations on memory cells having a poor data retention characteristic.

In addition, if the memory cell array 110 includes resistive memory cells, a reset writing operation or a set writing operation may be performed on the resistive memory cells. For example, in the resistive memory cell a set state has a relatively low resistance level and a reset state has a relatively high resistance level. When a writing operation is performed on the memory cell that increases the resistance level, the writing operation may be defined as a reset writing operation. Conversely, when a writing operation is performed on the memory cell that reduces the resistance level, the writing operation may be defined as a set writing operation. For example, a forward bias voltage may be applied to the memory cell in order to perform the set writing operation, and a backward bias voltage may be applied to the memory cell in order to perform the reset writing operation. Here, the memory cell on which the set writing operation is performed, for example the memory cell having the set state or the low resistance state, may have a poor retention characteristic due to properties of the variable resistive device. The control logic 130 may determine whether the memory cell is in the set state or in the reset state based on the data read from the memory cell, and may perform the re-writing operation on the memory cell in the set state. Otherwise, the control logic 130 may determine the resistance state of the memory cell, and may perform the re-writing operation on the memory cell having the low resistance state.

In some exemplary embodiments, the data may be refreshed by performing the re-writing operation only on the memory cell having the poor data retention state, for example, the memory cell in the set state or the low resistance state, thus efficiently improving data reliability and reducing power consumption caused by the refresh operation.

In addition, the memory controller 200 and the memory device 100 may be integrated to a semiconductor device and thus may configure a memory card, for example a PC card (a PCMCIA card), a compact flash card (CF card), a smart media card (SM/SMC), a memory stick, a multimedia card (MMC, RS-MMC, or MMCmicroO, a secure digital (SD) card (SD, miniSD, or microSD), or universal flash storage (UFS). As another example, the memory controller 200 and the memory device 100 may be integrated to a semiconductor device to configure a Solid State Disk/Drive (SSD).

Operation of the memory device 100 included in the resistive memory system 10 with the aforementioned structure will now be described.

Figure 2:
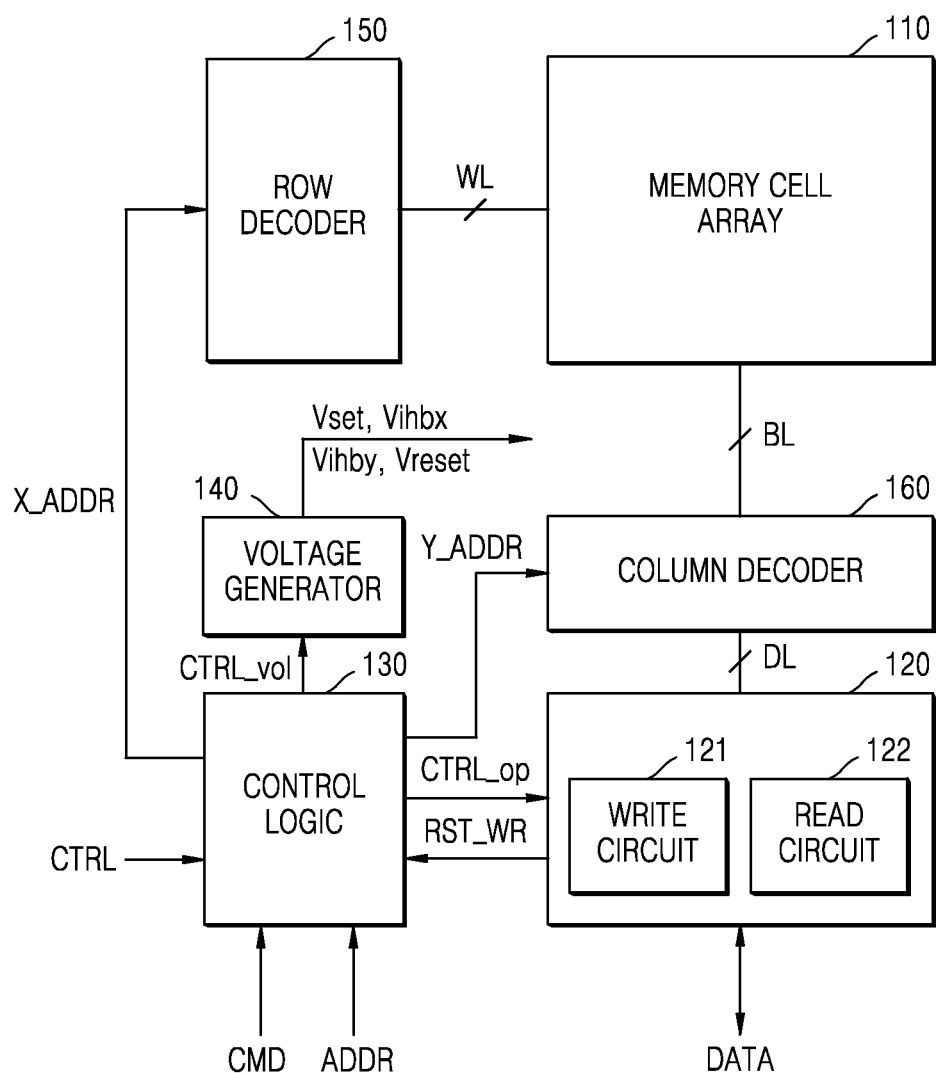
FIG. 2 is a block diagram showing an example of the memory device of FIG. 1.

Referring to FIG. 2, the memory device 100 may include the memory cell array 110, the write/read circuit 120, the control logic 130, a voltage generator 140, a row decoder 150, and a column decoder 160.

The memory cell array 110 may be connected to a plurality of first signal lines, a plurality of second signal lines, and a plurality of memory cells respectively arranged on respective regions where respective first signal lines intersect respective second signal lines. One or more exemplary embodiments will now be described assuming the first signal lines are bit lines BL and the second signal lines are word lines WL, as shown in FIG. 2.

An address ADDR for indicating an access-target memory cell may be received. The address ADDR may include a row address X_ADDR for selecting a word line of the memory cell array 110, and a column address Y_ADDR for selecting a bit line of the memory cell array 110. The row decoder 150 is connected to the memory cell array 110 via the word lines WL, and may select at least one of the word lines in response to the row address X_ADDR. The row decoder 150 receives a voltage from the voltage generator 140, and may transfer the voltage to the word lines WL. For example, the row decoder 150 may provide a selected word line WL with a ground voltage Vss or a reset write voltage Vreset, and may provide non-selected word lines WL with a column inhibit voltage Vihbx for blocking leakage current.

The column decoder 160 is connected to the memory cell array 110 via the bit lines BL, and may select at least one of the bit lines BL in response to the column address Y_ADDR. The column decoder 160 may receive a voltage from the voltage generator 140, and may provide the bit lines BL with the voltage. Also, the column decoder 160 may receive a write current pulse or a write voltage pulse from the write/read circuit 120 and may transfer the write current pulse or the write voltage pulse to the bit lines BL. For example, the column decoder 160 may provide a selected bit line BL with a set voltage Vset, a read voltage Vread, or a ground voltage Vss, and may provide a column inhibit voltage Vihby for preventing leakage current to non-selected bit lines BL.

The write/read circuit 120 is connected to the bit line BL via the column decoder 160 to write data in the memory cell or to read data from the memory cell. The write/read circuit 120 may write data DATA from outside into the memory cell array 110 or output data written in the memory cell array 110, as controlled by the control logic 130. Also, the write/read circuit 120 may provide the control logic 130 with a write/read result RST_WR. For example, the write/read circuit 120 performs a verification operation in order to detect the result of the writing operation, and may provide the control logic 130 with the verification result, for example pass or fail information.

The write/read circuit 120 may include a write circuit 121 and a read circuit 122. The write circuit 121 is connected to the selected bit line BL via the column decoder 160 to provide the selected memory cell MC with a program pulse, and thus performs a programming operation (writing operation). Thus, the data DATA to be stored may be input to the memory cell array 110. Here, the programming pulse may be referred to as a write pulse. In the exemplary embodiment, the programming pulse may be a current pulse. In another exemplary embodiments, the program pulse may be a voltage pulse.

In detail, the write circuit 121 may perform the set writing operation that programs the memory cell MC so that the resistance of the memory cell MC is reduced. Also, the write circuit 121 may perform the reset writing operation that programs the memory cell MC so that the resistance of the memory cell MC is increased.

The read circuit 122 is connected to the selected bit line BL via the column decoder 160, and may read the data DATA by sensing the resistance level of the selected memory cell MC. Thus, the data DATA stored in the memory cell array 110 may be output.

In detail, the read circuit 122 may perform a general reading operation on the memory cell MC if a read command is transmitted from the memory controller 200. Also, the read circuit 122 may perform the reading operation on the memory cell MC before performing the writing operation on the memory cell MC, that is, a pre-reading operation for reading an initial resistance state of the memory cell MC.

After performing the writing operation on the memory cell MC, the read circuit 122 may perform a verify reading operation for determining whether the writing in the memory cell MC is finished.

In a general reading operation, the read circuit 122 may provide the read data DATA to a component outside of the memory device 100, for example, the memory controller 200. Also, in the pre-reading operation or the verify reading operation, the read circuit 122 may provide a writing/reading operation result RST_WR signal to the control logic 130 based on the read data DATA or a pass/fail signal representing whether the reading or writing of the data to the memory device 100 has succeeded.

The voltage generator 140 may generate various voltages for performing the writing, reading, and erasing operations with respect to the memory cell array 110 based on a voltage control signal CTRL_vol. The voltage generator 140 may generate voltages for driving the plurality of word lines WL and bit lines BL, for example, the set write voltage Vset, the reset write voltage Vreset, the row inhibit voltage Vinhx, and/or the column inhibit voltage Vinhy.

The control logic 130 may output various control signals for writing data DATA in or reading data DATA from the memory cell array 110 based on the command CMD, the address ADDR, and the control signal CTRL transmitted from the memory controller 200. The various control signals output from the control logic 130 may be provided to the write/read circuit 120, the voltage generator 140, the row decoder 150, and the column decoder 160. Accordingly, the control logic 130 may control overall operations in the memory device 100.

The control logic 130 may provide the write/read circuit 120 with various operation control signals CTRL_op. Also, the control logic 130 may provide the row decoder 150 with a row address X_ADDR, and may provide the column decoder 160 with a column address Y_ADDR. Moreover, the control logic 130 may control various operations in the memory device 100 with reference to the writing/reading operation results RST_WR transmitted from the write/read circuit 120.

In addition, the memory device 100 in this exemplary embodiment may perform a refresh operation on the memory cell array 110 in order to prevent the data DATA written in the memory cell array 110 from being lost or changed due to a time lapse or repeated electric stresses applied to the memory cell array 110. The memory device 100 may determine the resistance state of the memory cells MC so as to determine whether the re-writing operation for refreshing data will be performed on the memory cell or determine a frequency of the re-writing operation, based on the resistance state of the memory cell.

In this exemplary embodiment, the re-writing operation for refreshing data may be selectively performed on those of the memory cells MC that have low resistance or set states. The re-writing operation may be not performed on those of the memory cells MC having high resistance or reset states. The low resistance state and the high resistance state may be distinguished based on a critical resistance level that is set in advance. A resistance state having a voltage level equal to or less than the critical resistance level may be referred to as being in a low resistance state, and a resistance state having a voltage level greater than the critical resistance level may be referred to as being in a high resistance state.

In another exemplary embodiment, frequency of performing the re-writing operation may be determined based on the resistance state of the memory cells. That is, the re-writing frequency with respect to a memory cell having a relatively higher resistance state may be lower than that with respect to a memory cell having a relatively lower resistance state.

The control logic 130 may control the memory device 100 to perform the above refresh operation. The control logic 130 determines data retention characteristics of the memory cells in which the data is written, and controls the memory device 100 to perform re-writing operations on memory cells having poor data retention characteristics. The control logic 130 may determine on which memory cells the re-writing operation will be performed, based on the resistance states of the memory cells read through the write/read circuit 120.

In this exemplary embodiment the control logic 130 may classify the memory cells as first memory cells having low resistance states and second memory cells having high resistance states based on the resistance states of the memory cells, and may control the memory device 100 to perform the re-writing operation on the first memory cells. The set writing operation may be performed on the first memory cells having the set state, and the reset writing operation may be performed on the second memory cells having the reset state. In the exemplary embodiment the control logic 130 may designate the memory cells having the highest resistance states as second memory cells, and the memory cells having resistance states other than the highest resistance state as first memory cells. Then the control logic 130 may control the memory device 100 to perform the re-writing operation on the first memory cells.

In one or more exemplary embodiments, in the re-writing operation the control logic 130 may control a bias voltage for the set writing operation to be applied to the first memory cells. In other exemplary embodiments, in the re-writing operation the control logic 130 may control a current pulse to be applied to the first memory cells.

In another possible exemplary embodiment, the control logic 130 may control the re-writing frequency on the memory cell having the relatively high resistance state to be lower than that on the memory cell having the relatively low resistance state, based on the resistance states of the memory cells that are read. The control logic 130 may control the memory device 100 to not perform the re-writing operation on the memory cells having the highest resistance states.

When controlling the timing of the refresh operation, the control logic 130 may monitor memory operations of the memory device 100, for example writing/reading operations, and may determine whether refresh operation of the memory cell array 110 is necessary. In this exemplary embodiment, the control logic 130 may control the memory device 100 to perform the refresh operation on the entire memory cell array 110 or some memory cells in it upon receiving a command CMD requesting the refresh operation from the memory controller 200. In another exemplary embodiment, the control logic 130 may monitor the memory operations of the plurality of cell regions included in the memory cell array 110 in a cell region unit, and may determine the necessity of the refresh operation in the cell region unit.

Figure 3:
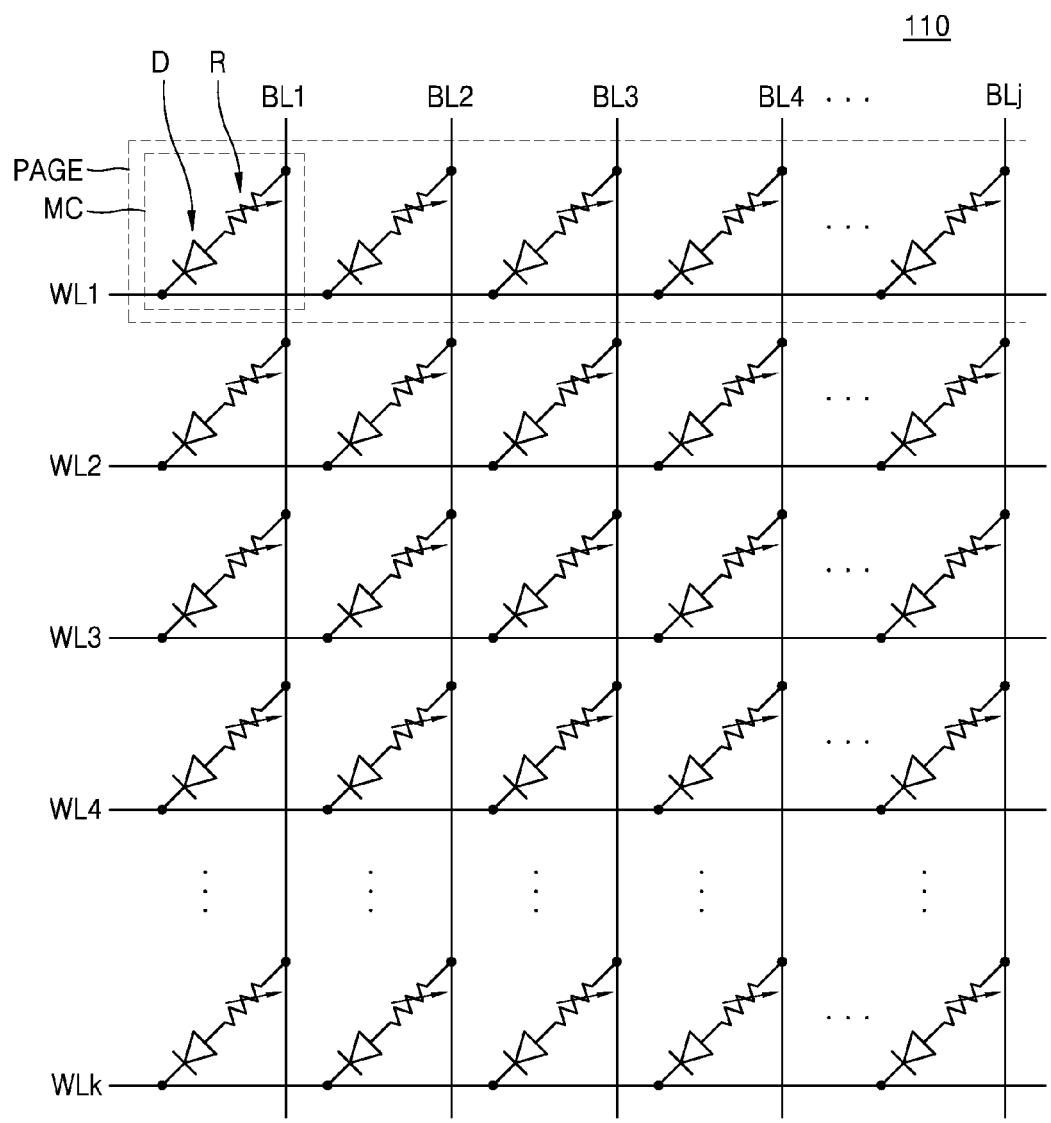
FIG. 3 is a circuit diagram of the memory cell array shown in FIG. 2.

Referring to FIG. 3, the memory cell array 110 may include a plurality of memory blocks, and may include memory cells of a horizontal structure. The memory cell array 110 may include a plurality of word lines WL1 through WLn, a plurality of bit lines BL1 through BLm, and a plurality of memory cells MCs. A group of memory cells MC selected by the same word line WL may be defined as a page PAGE. The number of word lines WL, the number of bit lines BL, and the number of memory cells MC may vary among different embodiments. In FIG. 3 as in general in these figures, large solid "dots" indicate where electrical lines actually electronically connect with each other rather than crossing over each other.

In this exemplary embodiment each of the plurality of memory cells MC may include a variable resistive device R and a selection device D. The variable resistance device R may be referred to as a variable resistance material, and the selection device D may be referred to as a switching device.

In this embodiment the variable resistance device R is connected between one of the bit lines BL1 through BLm and the selection device D, and the selection device D is connected between the variable resistance device R and one of the word lines WL1 through WLn. However, embodiments are not limited thereto. For example, the selection device D may be connected between one of the plurality of bit lines BL1 through BLm and the variable resistance device R, and the variable resistance device R may be connected between the selection device D and one of the plurality of word lines WL1 through WLn.

In this embodiment the variable resistance device R may be switched to one of a plurality of resistance states by an electric pulse applied thereto. The variable resistance device R may include a phase-change material, a crystallization status of which varies depending on an amount of electric current. The phase-change material may vary, and may be, for example, GaSb, InSb, InSe, $Sb_2Te_3$, or GeTe that are compounds of two elements, GeSbTe, GaSeTe, InSbTe, $SnSb_2Te_4$, or InSbGe that are compounds of three elements, and AgInSbTe, (GeSn)SbTe, GeSb(SeTe), or $Te_{81}Ge_{15}Sb_2S_2$ that are compounds of four elements.

The phase-change material may have an amorphous state having a relatively high resistance and a crystalline state having a relatively low resistance. The phase of the phase-change material may be changed by Joule's heat generated in accordance with the amount of electric current. In addition, the data may be written by using the phase change.

In addition, according to another exemplary embodiment of the inventive concept, the variable resistance device R may include perovskite compounds, transmission metal oxide, magnetic materials, ferromagnetic materials, or antiferromagnetic materials, instead of the phase-change material.

The selection device D may be connected between one of the plurality of word lines WL1 through WLn and the variable resistance material R, and may control supply of the electric current to the variable resistance device R in accordance with a voltage applied to the connected word line and the bit line. In this exemplary embodiment the selection device D may be a PN junction diode or a PIN junction diode. An anode of the selection device D may be connected to the variable resistance device R and a cathode of the diode may be connected to one of the plurality of word lines WL1 through WLn. Here, if a voltage difference between the anode and the cathode of the diode becomes greater than a threshold voltage of the diode, the diode is turned on so as to supply the electric current to the variable resistance device R. In FIG. 3, the selection device D is shown as a diode; however, one or more exemplary embodiments of the inventive concept are not limited thereto, that is, the selection device D may be another device that may be switched.

Figure 4:
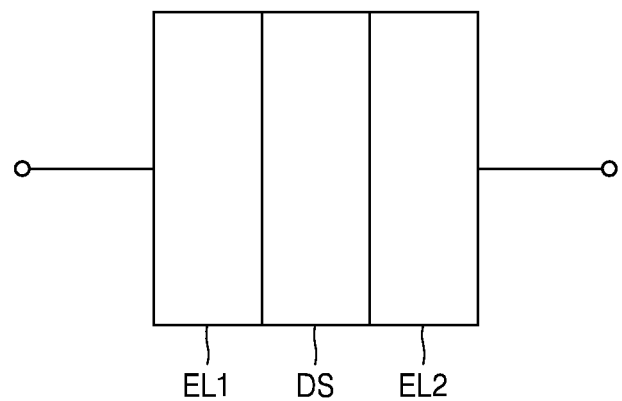
FIG. 4 is a diagram showing an example of a variable resistive device included in a memory cell in the embodiment of FIG. 3.

Referring to FIG. 4, the variable resistance device R included in the memory cell MC of FIG. 3 includes first and second electrodes EL1 and EL2 and a data storage film DS disposed between the first and second electrodes EL1 and EL2.

The first and second electrodes EL1 and EL2 may be formed of various metals, metal oxides, or metal nitrides, for example aluminium (Al), copper (Cu), titanium nitride (TiN), titanium aluminium nitride (TixAlyNz), iridium (Ir), platinum (Pt), silver (Ag), gold (Au), poly silicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd). tin (Sn), zirconia (Zr), zinc (Zn), iridium oxide ($IrO_2$), and/or strontium zirconate oxide ($StZrO_3$).

The data storage film DS may be a bipolar resistive memory material or a unipolar resistive memory material. The bipolar resistive memory material may be programmed as a set state or a reset state in accordance with polarity of the pulse, and the unipolar resistive memory material may be a perovskite-based material. In addition, the unipolar resistive memory material may be programmed as a set state or a reset state according to the pulses of the same polarity, and the unipolar resistive memory material may be a transition metal oxide such as NiOx or TiOx.

Figure 5A:
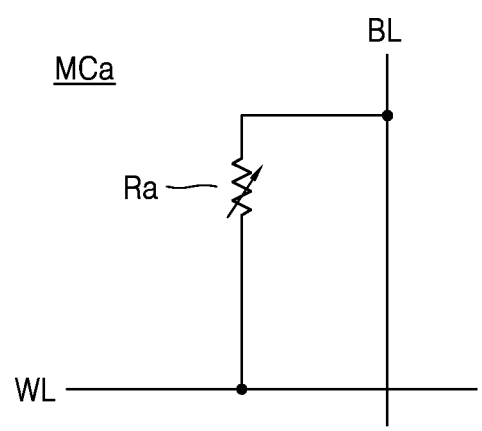
FIGS. 5A through 5C are circuit diagrams showing modified examples of the memory cell of FIG. 3.

Referring to FIG. 5A, a memory cell MCa includes a variable resistance device Ra which may be connected between a bit line BL and a word line WL. The memory cell MCa may store data by using voltages applied to the bit line BL and the word line WL.

Figure 5B:
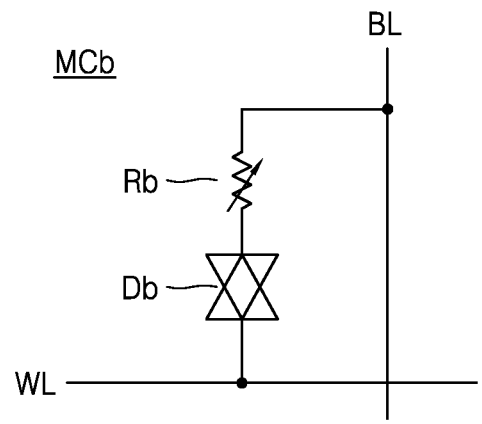

Referring to FIG. 5B, a memory cell MCb may include a variable resistance device Rb and a bidirectional diode Db. The variable resistance device Rb may include a resistor material for storing data. The bidirectional diode Db is connected between the variable resistance device Rb and the word line WL, and the variable resistance device Rb may be connected between the bit line BL and the bidirectional diode Db. Locations of the bidirectional diode Db and the variable resistance device Rb may be exchanged. A leakage current flowing in non-selected resistor cells may be blocked by the bidirectional diode Db.

Figure 5C:
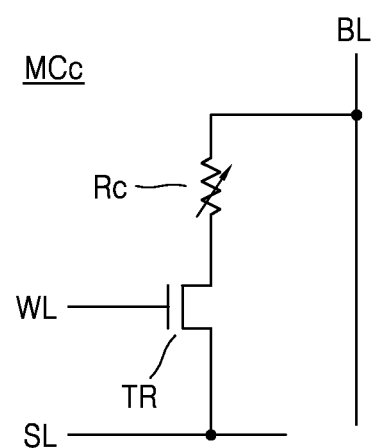

Referring to FIG. 5C, a memory cell MCc may include a variable resistance device Rc and a transistor TR. The transistor TR may be a selection device for supplying or blocking the electric current to the variable resistance device Rc according to a voltage of the word line WL, that is, a switching device. The transistor TR is connected between the variable resistance device Rc and the source line SL, and the variable resistance device Rc may be connected between the bit line BL and the transistor TR. Locations of the transistor TR and the variable resistance device Rc may be exchanged. The memory cell MCc may or may not be selected by the turning on/turning off of the transistor TR that is driven by the word line WL.

Figure 6A:
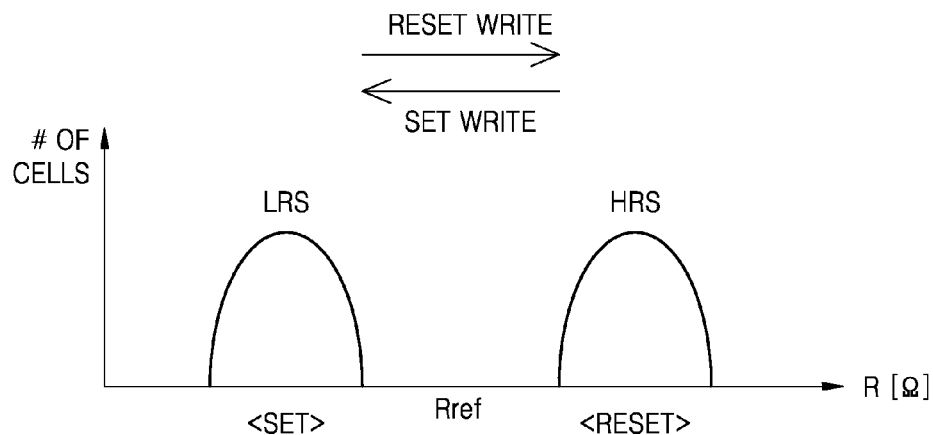
FIGS. 6A and 6B are graphs of resistance distribution of memory cells.
Figure 6B:
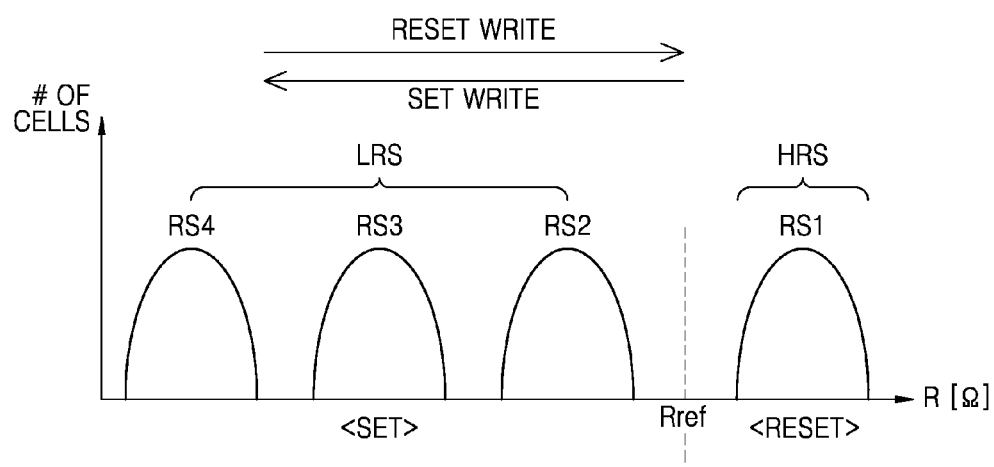

FIG. 6A shows a case where the memory cell MC is an SLC, and FIG. 6B shows a case where the memory cell MC is an MLC. In FIGS. 6A and 6B, horizontal axes indicate resistance, and vertical axes indicate number of memory cells MC.

Referring to FIG. 6A, if the memory cell MC is a single level cell SLC programmed with one bit, the memory cell MC may have a low resistance state LRS or a high resistance state HRS. In this exemplary embodiment resistance states RS1 through RS4 may be classified as high resistance states HRS and low resistance states LRS based on a critical resistance level Rref. The low resistance state LRS may be referred to as the set state, and the high resistance state HRS may be referred to as the reset state.

The low resistance state LRS and the high resistance state HRS may respectively correspond to one of data '0' and data '1'. In this exemplary embodiment the resistance level R increases from data '0' to data '1', with the low resistance state LRS corresponding to data '0' and the high resistance state HRS corresponding to data '1'.

An operation of applying a write pulse to the memory cell MC to switch the memory cell MC from the high resistance state HRS to the low resistance state LRS may be referred to as a set operation or a set writing operation. Applying the write pulse to the memory cell MC to switch the memory cell MC from the low resistance state LRS to the high resistance state HRS may be referred to as a reset operation or a reset writing operation.

Referring to FIG. 6B, if the memory cell MC is the multilevel cell programmed with two bits, a resistance value of the memory cell MC may have one of a first resistance state RS1, a second resistance state RS2, a third resistance state RS3, and a fourth resistance state RS4.

However, one or more exemplary embodiments are not limited thereto, that is, in another exemplary embodiment, the plurality of memory cells MC may include triple level cells TLCs storing data of three bits. Accordingly, the memory cells may have one of eight resistance states according to the written data. In another exemplary embodiment, the plurality of memory cells MC may include memory cells storing data of four-bits or greater.

Since the multi-level cell MLC has narrower intervals between resistance distributions than those of the single level cell SLC, a read error may occur due to a small variation in the resistance. Therefore, the resistance states RS1, RS2, RS3, and RS4 may have resistor ranges that do not overlap with each other in order to ensure a read margin.

In this exemplary embodiment the resistance states RS1 through RS4 may be classified as either the high resistance state HRS or the low resistance state LRS, depending on their value relative to the critical resistance level Rref. For example, as reflected in FIGS. 6A and 6B, since the critical resistance level Rref is located between the first resistance state RS1 and the second resistance state RS2, therefore the second, third, and fourth resistance states RS2, RS3, RS4 will be classified as having resistance states LRS since they have lower resistance than the critical resistance level Rref. Conversely, since the first resistance state RS1 is greater than the critical resistance level Rref, it will be classified as having the high resistance state HRS. Additionally, the low resistance state LRS may be referred to as the set state, while the high resistance state HRS may be referred to as the reset state.

Each of the first, second, third, and fourth resistance states RS1, RS2, RS3, RS4 may correspond to one of data '00', data '01', data '10', and data '11'. In this exemplary embodiment the resistance level R may increase in order of the data '11', the data '01', the data '00', and the data '10'. That is, the fourth resistance state RS4 may correspond to the data '11', the third resistance state RS3 may correspond to the data '01', the second resistance state RS2 may correspond to the data '00', and the first resistance state RS1 may correspond to the data '10'.

Figure 7:
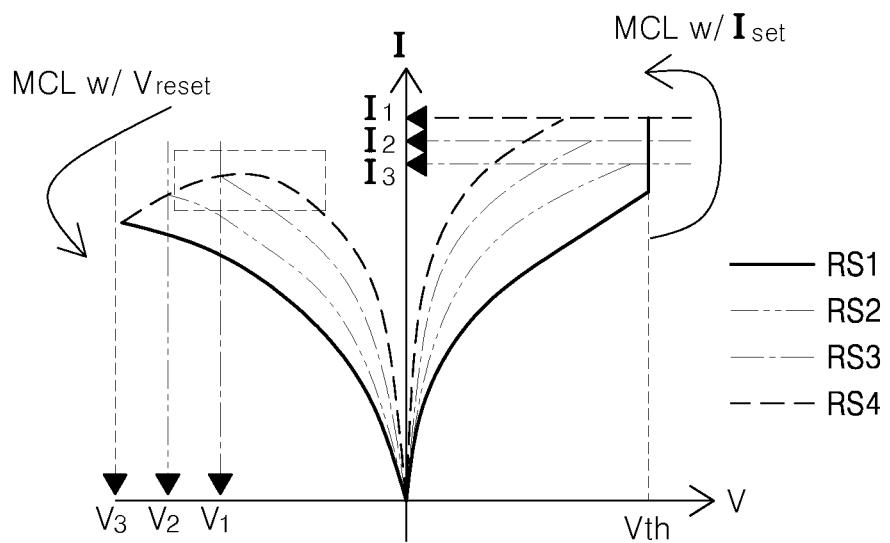
FIG. 7 is a graph of a voltage-current characteristic of a memory cell.

In, FIG. 7, the horizontal axis denotes voltage V, and the vertical axis denotes current I. If the memory cell MC is a multi-level cell MLC, the memory cell MC may have one of the plurality of resistance states according to data stored therein. For example, as shown in FIG. 7, the memory cell MC may have one of the first through fourth resistance states RS1, RS2, RS3, RS4. Here, the resistance level is the largest when the memory cell MC is in the first resistance state RS1, and the resistance level is the smallest when the memory cell MC is in the fourth resistance state RS4.

As shown in right side of the graph of FIG. 7, the resistance level of the memory cell MC may be reduced through the set writing operation. Conversely, as shown in left side of the graph, the resistance level of the memory cell MC may be increased through the reset writing operation.

In a case where the resistance level of the memory cell MC is the first resistance state RS1, which is the largest, if a voltage equal to or greater than a threshold voltage Vth is applied to the memory cell MC, current in the memory cell MC is rapidly increased. Thus, it is not easy to control the current for writing the resistance level according to the data to be programmed. Therefore, in this exemplary embodiment, when performing the set writing operation on the memory cell MC, a write current Iset or a write current pulse may be applied to the memory cell MC.

In this exemplary embodiment, the memory cell MC may be switched from the first resistance state RS1 to one of the second through fourth resistance states RS2, RS3, RS4 according to the change in a magnitude of the set write current Iset or the set write pulse. In detail, when a first write current I1 is applied to the memory cell MC, the memory cell MC may be switched from the first resistance state RS1 to the fourth resistance state RS4. In addition, when a second write current I2 is applied to the memory cell MC, the memory cell MC may be switched from the first resistance state RS1 to the third resistance state RS3. Moreover, when a third write current I3 is applied to the memory cell MC, the memory cell MC may be switched from the first resistance state RS1 to the second resistance state RS2.

Also, in an exemplary embodiment, the memory cell MC may be switched from the second resistance state RS2 to the fourth or third resistance state RS4 or RS3, according to the change in the magnitude of the set write current Iset or the set write current pulse, and the memory cell MC may be switched from the third resistance state RS3 to the fourth resistance state RS4.

If the memory cell MC is in one of the second through fourth resistance states RS2, RS3, RS4, the current applied to the memory cell MC must be adjusted to increase to a peak (denoted as a dotted box in FIG. 7), and then decrease, in order to perform the reset writing operation. Thus, it is not easy to perform the reset writing operation on the memory cell MC by using a general square pulse. Therefore, in this exemplary embodiment a write voltage pulse Vreset may be applied to the memory cell MC when performing the reset writing operation on the memory cell MC.

In this embodiment the memory cell MC may be switched from the fourth resistance state RS4 to one of the first through third resistance states RS1, RS2, RS3 according to a change in the reset write voltage Vreset or a reset write voltage pulse. In detail, when a first write voltage V1 is applied to the memory cell MC, the memory cell MC may be switched from the fourth resistance state RS4 to the third resistance state RS3. Also, when a second write voltage V2 is applied to the memory cell MC, the memory cell MC may be switched from the fourth resistance state RS4 to the second resistance state RS2. In addition, when a third write voltage V3 is applied to the memory cell MC, the memory cell MC may be switched from the fourth resistance state RS4 to the first resistance state RS1.

In this exemplary embodiment, when the magnitude of the reset write voltage Vreset or the reset write voltage pulse is changed, the memory cell MC may be switched from the third resistance state RS3 to the second or first resistance state RS2 or RS1. In addition, the memory cell MC may be switched from the second resistance state RS2 to the first resistance state RS1.

Figure 8A:
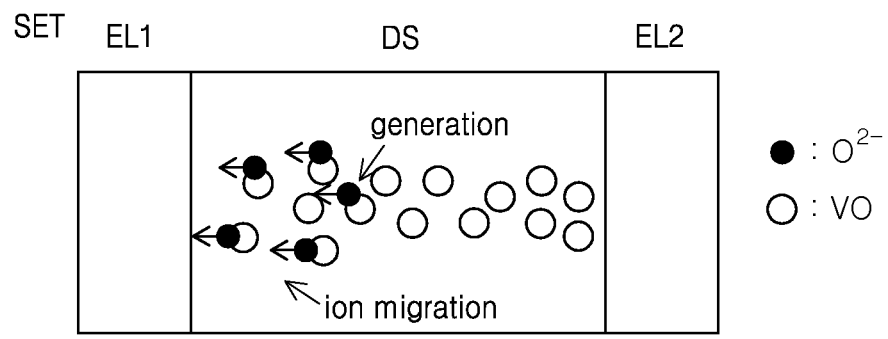
FIGS. 8A and 8B are diagrams showing operations in a variable resistive device when a set writing operation or a reset writing operation is performed on the memory cell of FIG. 3.
Figure 8B:
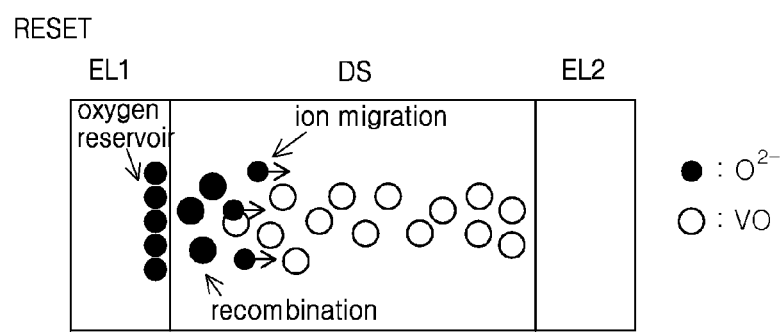

FIG. 8A shows an operation in the variable resistance device when performing the set writing operation on the memory cell MC of FIG. 3, and FIG. 8B shows an operation in the variable resistance device when performing the reset writing operation on the memory cell MC of FIG. 3.

Referring to FIG. 8A, during the set writing operation on the memory cell MC, the voltage of the first electrode EL1 may be greater than that of the second electrode EL2, based on application of the write current pulse. Due to the voltage difference between the first and second electrodes EL1 and EL2, oxygen ions and void Vo may be separated from each other in the data storage film DS, which is a metal oxide layer. In addition, ion migration may occur, so that oxygen ions $O_2-$ move toward the first electrode EL1.

Due to the ion migration, filaments including the void Vo may be generated in the data storage film DS, and accordingly resistance level of the memory cell MC may be reduced. Thickness of the filament and a density of the filament may vary depending on amplitude and pulse width of the write current pulse applied to the memory cell MC, so that resistance level R of the memory cell MC is changed.

Referring to FIG. 8B, during the reset writing operation on the memory cell MC, for example, the voltage of the second electrode EL2 may be greater than that of the first electrode EL1, based on application of the write voltage pulse. Thus, ion migration occurs, so that oxygen ions $O_2-$ stored in the first electrode EL1 move toward the data storage film DS, and accordingly oxygen ions $O_2-$ are recombined with the void Vo in the data storage film DS so that the filament is cut and the resistance level of the memory cell MC increases.

Figure 9:
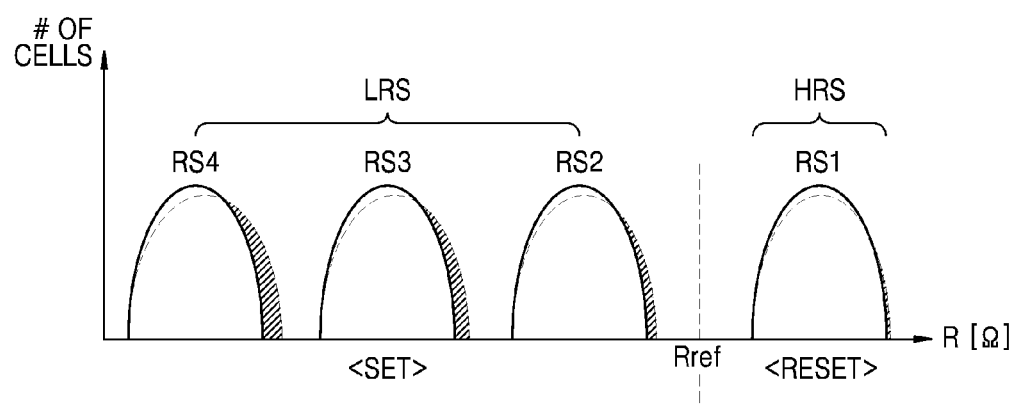
FIG. 9 is a diagram showing variation in resistance distribution of the memory cells.

FIG. 9 shows the resistance states of the memory cells MCs in a case where the memory cells MCs are multi-level cells MLC programmed with 2 bits. Referring to FIG. 9, each of the memory cells MC may have one of the first through fourth resistance states RS1, RS2, RS3, RS4. When the data is written in the memory cell MC through the set write or the reset writing operation, the memory cells MC may have resistance distributions as denoted in the figure by solid lines.

After that, the resistance distribution of the memory cell MC may be widened in a direction in which the resistance level increases, as denoted in the figure by dotted lines. After writing data in the memory cell MC, the resistance level of the memory cell MC may increase according to a time lapse or continuous stress applied thereon. In the variable resistance device of the memory cell MC, oxygen ions $O_2-$ are likely to return to stabilized states through oxidation reaction, that is, recombining with void Vo, and thus the filament is cut due to the oxidation and the resistance level of the memory cell MC is increased.

If the reset writing is performed on the memory cell MC, for example, if the memory cell MC is in the reset state RESET or the high resistance state HRS, amount of the filament is less than that for the set writing operation so that, for example, the memory cell MC is in the set state or the low resistance state. Thus, in this case the memory cell MC is less affected by the oxidation. Therefore, as shown in FIG. 9, in the high resistance state HRS variation in the resistance distribution of the memory cell MC may be less than that in the low resistance state LRS. Also, even if the resistance level of the memory cell MC increases in the high resistance state HRS, for example the first resistance state RS1, its resistance in the low resistance state LRS, for example the second resistance state RS2, is not affected. Therefore, the data retention property of the memory cells MC in the high resistance state HRS may be superior to that of the memory cells MC in the low resistance state LRS. Thus, according to one or more exemplary embodiments, re-writing is performed with respect to the memory cells MC in the low resistance state LRS or the set state SET having relatively poor data retention property in order to return the resistance levels of the memory cells MC to initial resistance levels, and thus, the data retention property of the memory cells MC in the low resistance state LRS is recovered and the data reliability of the memory device 100 (FIG. 2) may be improved.

Figure 10A:
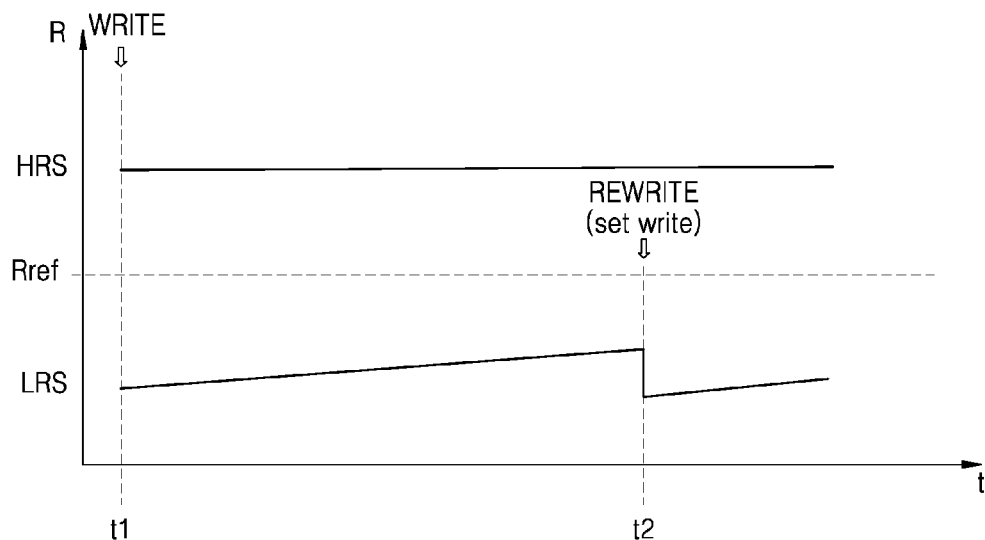
FIGS. 10A and 10B are graphs illustrating a method of operating a memory device according to an exemplary embodiment.
Figure 10B:
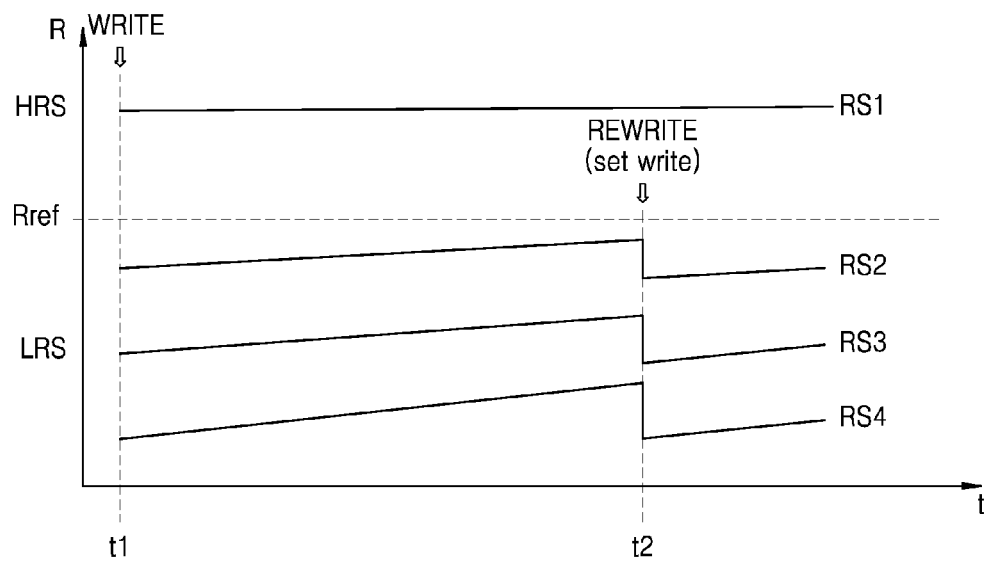

FIGS. 10A and 10B are graphs illustrating a method of operating a memory device according to an exemplary embodiment. FIG. 10A shows a case where the memory cell is a single level cell SLC, and FIG. 10B shows a case where the memory cell is a multi level cell MLC. In FIGS. 10A and 10B, horizontal axes denote time, and vertical axes denote resistance levels of the memory cells.

Referring to FIG. 10A, if the memory cells are single level cells SLC, when a writing operation is performed on the memory cells at t1, the memory cells become high resistance states HRS or low resistance states LRS. The high resistance state HRS and the low resistance state LRS may be classified according to a set critical resistance level Rref. As time has elapsed, the resistance level of the low resistance state LRS may increase. Accordingly, the memory device 100 determines to perform a refresh operation at t2, and then may perform a re-writing operation on the memory cells in the low resistance state LRS to recover the resistance level of the low resistance state LRS. Here, since the resistance level of the low resistance state LRS has to be reduced, a set writing operation may be performed on the memory cells of the low resistance state LRS.

In addition, since the resistance level of the high resistance state HRS does not change much between t1 and t2, the re-writing operation may be not performed on the memory cells of the high resistance state HRS.

Referring to FIG. 10B, if the memory cells are multi level cells MLC, when a writing operation is performed on the memory cells at t1, the memory cells may have one of the plurality of resistance states RS1 through RS4. Differences between the resistance levels of the resistance states RS1 through RS4 are not limited to the examples shown in FIG. 10B. The difference between the resistance levels of the first resistance state RS1 and the second resistance state RS2 may be greater than the differences between the resistance levels of the other resistance states RS2 through RS4, for example.

The plurality of resistance states RS1 through RS4 may be classified as the high resistance state HRS or the low resistance state LRS based on comparison with the critical resistance level Rref. As shown in FIG. 10B, the first resistance state RS1, which is the highest resistance state, may be classified as the high resistance state HRS, and the other resistance states, for example, the second through fourth resistance states RS2 through RS4, may be classified as the low resistance state LRS. After writing data on the memory cells, the resistance level of the low resistance state LRS may increase with time. Here, the resistance level of the lowest resistance state, in this case the fourth resistance state RS4, may increase the most, and the resistance level of the high resistance state HRS may increase only a little. Accordingly, the memory device 100 may determine to perform a refresh operation at t2, and may perform the re-writing operation on the memory cells of the low resistance state LRS to recover the resistance level. As described above, since the resistance level of the low resistance state LRS has to be reduced, the set writing operation may be performed on the memory cells in the low resistance state LRS. In an exemplary embodiment, the set writing operation may be performed by applying current pulses to the memory cells in the low resistance state LRS.

Figure 11:
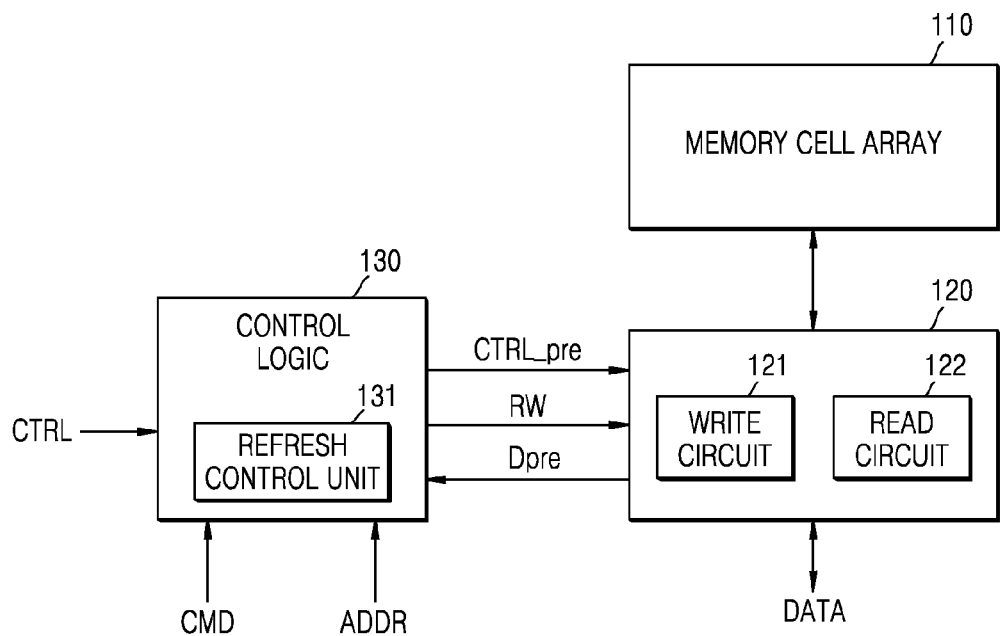
FIG. 11 is a diagram showing an example of an operation of the memory device according to an exemplary embodiment.

FIG. 11 is a diagram illustrating an example of the operation of the memory device according to the exemplary embodiment of the inventive concept. An example of the refresh operation of the memory device will now be described with reference to FIG. 11.

Referring to FIG. 11, the control logic 130 may include a refresh control unit 131. The refresh control unit 131 is a circuit for controlling the refresh operation of the memory device 100 (FIG. 2), and may determine timing of performing the refresh, a cell region that is to be refreshed, and memory cells on which the re-writing will be performed.

In this exemplary embodiment, the refresh control unit 131 may receive a refresh command CMD from outside, for example from the memory controller 200, and may determine the timing of performing the refresh operation based on the refresh command CMD. For example, the refresh control unit 131 may determine the timing of the refresh operation so that the refresh may be performed upon receiving the refresh command CMD, or a while after the receipt of the refresh command CMD. For example, if the memory device 100 is performing a writing or reading operation, the timing of the refresh operation may be determined so that the refresh may be performed after finishing the writing or reading operation.

In one or more exemplary embodiments, the memory cell array 110 may include a plurality of memory cell regions. In addition, the refresh control unit 131 may receive the refresh command CMD and an address ADDR indicating the cell region from the memory controller 200, and then may determine the timing of the refresh operation by the cell region unit. In another exemplary embodiment, the refresh control unit 131 may determine the cell region that is to be refreshed from among the plurality of cell regions in the memory cell array 110, and may determine to perform the refresh operation on the above determined cell region upon receiving the refresh command CMD from outside.

According to another exemplary embodiment, the refresh control unit 131 may increase a counting value representing the number of reading operations whenever receiving a read command CMD. Then the refresh control unit 131 may determine to perform the refresh operation when the counting value reaches a reference value. Here, the refresh control unit 131 may determine whether to perform the refresh operation by the cell region unit, by counting the read command CMD with respect to the cell region.

In another exemplary embodiment, the refresh control unit 131 may perform error detection from the data DATA read from the memory cell array 110, and may determine to perform the refresh operation if the number of errors that have occurred is equal to or greater than a predetermined error reference value. The refresh control unit 131 may perform the error detection by the cell region unit, and then determine whether to perform the refresh operation.

In another exemplary embodiment, the refresh control unit 131 may include a timer (not shown) therein, and may determine to perform the refresh operation with a predetermined period in consideration of the characteristics of the memory device 100. Another possibility would be to determine to perform the refresh operation on the memory cell in which the data is written when a predetermined time has passed after the data is written in the memory cell.

As described above, the refresh control unit 131 determines to perform the refresh operation, and then may determine resistance states of the memory cells.

In this exemplary embodiment, the refresh control unit 131 reads data from the memory cells, and may determine the resistance state of each of the memory cells based on the read data. The refresh control unit 131 may transmit a pre-read signal CTRL_pre to the write/read circuit 120. In response to the pre-read signal CTRL_pre, the read circuit 122 may pre-read the resistance states of at least some of the memory cells in the memory cell array 110. In this exemplary embodiment the read circuit 122 may read the resistance states of the memory cells by applying a voltage that is different from the read reference voltage during a general reading operation.

The read circuit 122 may provide the refresh control unit 122 with the resistance states of the memory cells as pre-read data Dpre in a bit-data format.

The refresh control unit 131 determines the resistance state of each of the memory cells based on the pre-read data Dpre, and may control the memory device 100 to perform the re-writing operation on memory cells having resistance states that are lower than the critical resistance level (such memory cells will be hereinafter referred to as first memory cells). The refresh control unit 131 determines the memory cells on which the re-writing operation is to be performed, and may provide the write/read circuit 120 with a re-writing signal RW. The control logic 130 may provide the row decoder 150 (FIG. 2) and the column decoder 160 (FIG. 2) with the address for selecting the memory cells on which the re-writing operation is to be performed. The write/read circuit 120 may perform the re-writing operation on the selected memory cells. In one exemplary embodiment, in order to recover the resistance levels of the first memory cells, the set writing operation may be performed for reducing the resistance level of the first memory cells when performing the re-writing operation. Also, as described above with reference to FIG. 7, the current pulses may be applied to the first memory cells when the set writing operation is performed.

In one or more exemplary embodiments, when it is determined to perform the refresh operation based on a count of reading operations or the error detection operation, the pre-reading operation may be omitted. For example, since the reading operation is performed in response to the read command CMD before determining the refresh operation, the read circuit 122 may store the read data in a buffer (not shown) included therein and may provide the refresh control unit 131 with the read data when it is determined that the refresh operation is to be performed. The refresh control unit 131 may determine the resistance state of each of the memory cells based on the read data, and may determine the memory cells on which the re-writing operation is to be performed.

In another exemplary embodiment, write information on the memory cells, for example address information of the memory cells written in the high resistance state or the memory cells written in the low resistance state, may be stored in a storage unit (not shown) of the memory device 100 (FIG. 1). When it is determined to perform the refresh operation, the refresh control unit 131 accesses the storage unit to determine the resistance states of the memory cells, and determines the memory cells on which the re-writing operation is to be performed. In this case, reading the memory cells in order to determine the resistance states of the memory cells may be omitted.

In another exemplary embodiment, the write information about the memory cells may be stored in the memory controller 200 (FIG. 1), which may provide the memory device 100 with the address ADDR indicating the cell regions in which the refresh operation is to be performed, and the memory cells on which the re-writing is to be performed, along with the refresh command CMD. The refresh control unit 131 determines the timing of the refresh operation based on the received refresh command CMD, and may control the re-writing operation to be performed on the memory cells corresponding to the address ADDR.

In FIG. 11 the refresh control unit 131 is shown as included in the control logic 130, but embodiments of the inventive concept are not limited thereto. The refresh control unit 131 may be realized as hardware or software on outer side of the control logic 130 for example.

Figure 12:
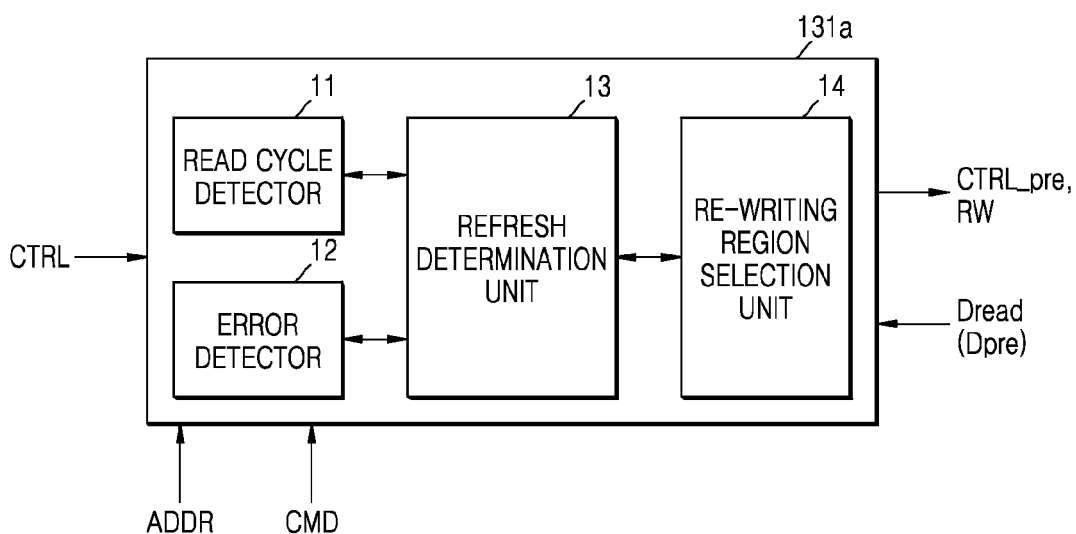
FIG. 12 is a block diagram showing an example of a refresh control unit in the embodiment of FIG. 11.

FIG. 12 is a block diagram showing an example of the refresh control unit 131 of FIG. 11. Referring to FIG. 12, a refresh control unit 131a may include a read cycle detector 11, an error detector 12, a refresh determination unit 13, and a re-writing region selection unit 14.

The read cycle detector 11 may detect the read cycle by using at least one of the command CMD and/or the address ADDR. The read cycle detector 11 may include a counter (not shown). If it is identified that the command CMD is the read command, the counter may increase a counting value. Also, if the refresh operation is performed by the cell region unit, the read cycle detector 11 may identify at least some of the bits in the address ADDR to detect the cell region that is necessary to be refreshed.

In addition, the error detector 12 performs error detection operation with respect to the read data Dread transmitted from the write/read circuit 120, and detects the number of detected errors. Also, the error detector 12 may compare the number of detected errors with a predetermined reference value, and output the comparison result. The refresh determination unit 13 receives various detection results or comparison results from the read cycle detector 11 and the error detector 12, determines whether to perform the refresh operation on at least some of the cell regions in the memory cell array 110, and generates a determination result. The refresh control unit 131a may control the refresh operation to be performed based on the determination result. The refresh control unit 131a may transmit the pre-read signal CTRL_pre to the write/read circuit 120 (FIG. 1).

In addition, read data Dread (for example pre-read data Dpre may be transmitted from the write/read circuit 120 in response to the pre-read signal CTRL_pre. The pre-read data Dpre may include the read resistance states of the memory cells as bit data format. The re-writing region selection unit 14 determines the resistance state of each of the memory cells based on the pre-read data Dpre, and then determines the memory cells on which the re-writing operation is to be performed. As described above, the re-writing region selection unit 14 may determine the memory cells in the low resistance state as the memory cells on which the re-writing operation is to be performed.

In another exemplary embodiment, if the write information about the memory cells is stored in the storage unit included in the memory device 100 (FIG. 1) or the memory controller 200 (FIG. 1), the re-writing region selection unit 14 accesses the storage unit of the memory device 100 to determine the resistance states of the memory cells and determine the memory cells on which the re-writing operation is to be performed.

Figure 13:
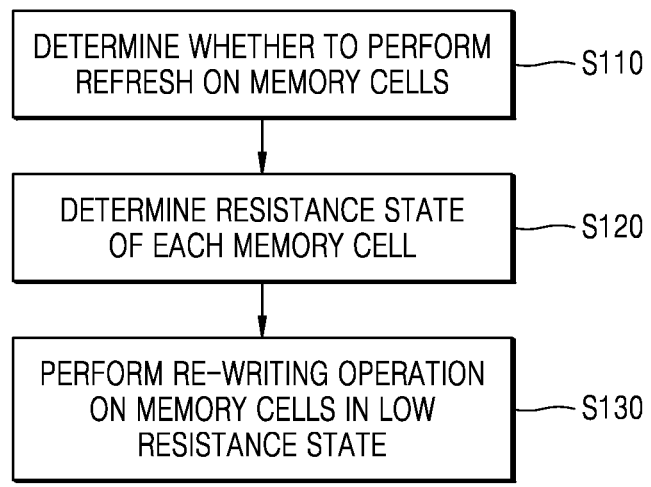
FIG. 13 is a flowchart illustrating a method of operating a memory device according to an exemplary embodiment.

FIG. 13 is a flowchart illustrating an exemplary method of operating the memory device according to embodiments of FIGS. 1 through 12.

Referring to FIG. 13, it is determined (S110) whether to perform the refresh operation with respect to at least some of the memory cells in the memory cell array. In one exemplary embodiment, when a refresh command is transmitted from outside, for example from the memory controller, it may be determined to perform the refresh operation. In another exemplary embodiment, when a predetermined reference time has passed after the writing is performed on the memory cells, it may be determined to perform the refresh operation on the memory cells. In another exemplary embodiment, the writing or reading operation of the memory device is monitored, and then a time point when the memory cells need to be refreshed may be determined through the above operation.

When it is determined to perform the refresh operation, the resistance state of each of the memory cells may be determined (S120). In one exemplary embodiment, the resistance states of the memory cells may be determined by reading data from the memory cells. The reading operation may be a pre-reading operation before performing the re-writing operation. In another exemplary embodiment, the resistance states of the memory cells may be determined based on the write information about the memory cells.

Each of the memory cells may have one of a plurality of resistance states that are classified according to resistance level. The memory cells may be classified as in the low resistance state or in the high resistance state based on their respective determined resistance states. As described above, the low resistance state and the high resistance state may be determined based on critical resistance level that is set in advance. In one exemplary embodiment, the uppermost resistance state having the highest resistance level from among the plurality of resistance states may be classified as the high resistance state, and the remaining resistance states may be classified as the low resistance states. Here, the high resistance state may be referred to as the reset state and the low resistance state may be referred to as the set state.

The re-writing operation is then performed (S130) on the memory cells in the low resistance state. The memory cells in the low resistance state are the memory cells in which the data is written in the set writing operation, and may have poor data retention characteristic since the resistance levels of the memory cells increase with time after writing the data in the memory cells. The set writing operation is performed again on the memory cells in the low resistance state to reduce the resistance levels, and thus the resistance levels of the memory cells in the low resistance state may be recovered. In this way the data retention characteristics of the memory cells in the low resistance state may be compensated for, and data reliability of the memory cells may be improved.

Figure 14:
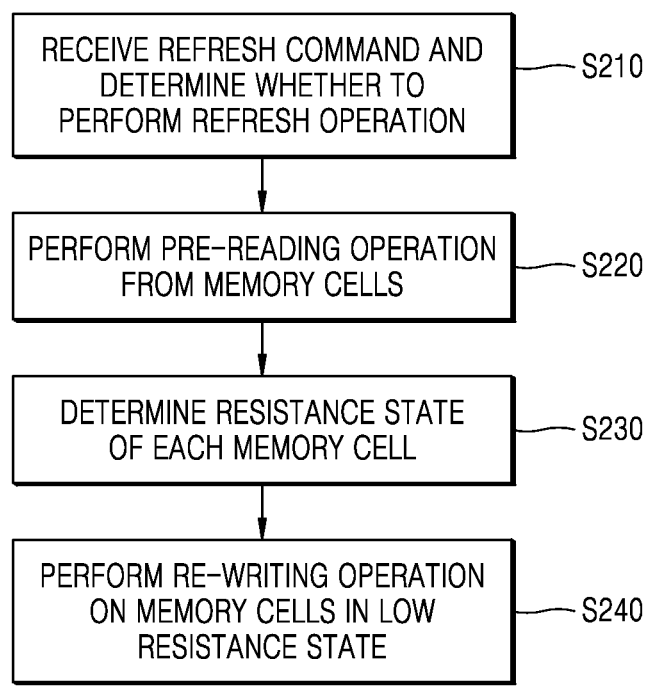
FIG. 14 is a flowchart illustrating an example of the method of operating the memory device of the embodiment of FIG. 13.

Referring to FIG. 14, the memory device may receive (S210) a refresh command from the outside, for example from the memory controller. In this exemplary embodiment the memory controller determines whether the refresh operation is performed by using the memory device, that is, the timing of performing the refresh, and the memory device may perform the refresh operation in response to the refresh command transmitted from the memory controller.

In order to perform the refresh operation, a pre-reading operation from the memory cells may be performed (S220). When resistance levels of the memory cells are sensed through the pre-reading operation, the resistance state of each of the memory cells may be determined (S230). As described above, the write/read circuit 120 (FIG. 2) provides the control logic 130 or the refresh control unit 131 with the pre-read data, and the control logic 130 or the refresh control unit 131 may determine the resistance state of each of the memory cells based on the pre-read data. Each of the memory cells may have one of the plurality of resistance states. In addition, the plurality of resistance states may be classified as the low resistance state or the high resistance state.

After that, the re-writing operation, for example, the set writing operation on the memory cells in the low resistance state is performed (S240) to recover the resistance level of the low resistance state.

Figure 15:
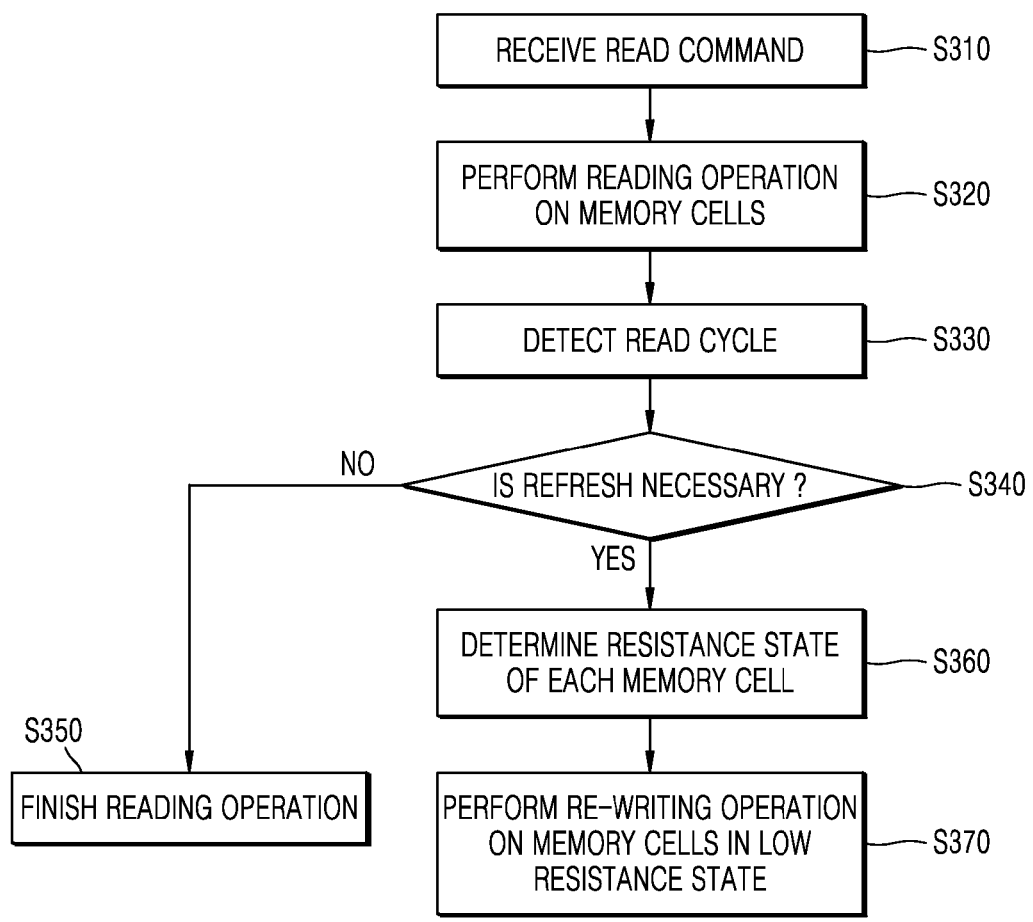
FIG. 15 is a flowchart illustrating an example of the method of operating the memory device of the embodiment of FIG. 13.

Whether to perform the refresh operation in the memory device 100 of FIG. 1 may be determined according to a status of performing the writing/reading operation of the memory device 100. Referring to FIG. 15, a read command is received (S310) from outside, for example from the memory controller (S310). In this exemplary embodiment the read command and an address indicating a cell region that is to be read may be received together.

A reading operation is performed (S320) on the memory cells indicated by the address. Read data may be output to the memory controller, or may be provided to the refresh control unit 131.

In addition, a read cycle may be detected (S330) with performance of or after performing the reading operation (S320). Whenever the read command is received, a counting value representing the number of reading operations increases to detect the read cycle. As described above, the read cycle may denote the read cycle of the entire memory cell array or of some of the memory cell array.

According to a result of detecting the read cycle, it may be determined (S340) whether a refresh operation is necessary. For example, if the counting value does not reach a predetermined reference value, the memory device may determine that the refresh operation is not necessary and may finish (S350) the reading operation. If the counting value reaches the predetermined reference value, the memory device determines that the refresh operation is necessary, and then, may perform the refresh operation on the memory cell array. The refresh operation may be performed on the entire memory cell array or on some of the memory cell array.

The resistance states of at least some memory cells in the memory cell array, for example, the memory cells from which data is read according to the above address, may be determined (S360). In this exemplary embodiment, the resistance states of the above memory cells are pre-read, and then the resistance states may be determined. In another exemplary embodiment, the resistance states of the memory cells may be determined based on the data read (S320) as described above.

After that, the memory cells are classified as either memory cells in the low resistance state or memory cells in the high resistance state based on the resistance state, and the re-writing operation, for example, the set writing operation, may be performed (S370) on the memory cells in the low resistance state.

Whether to perform the refresh operation in the memory device 100 (FIG. 1) may be determined in the memory device 100 based on a status of performing the writing/reading operation of the memory device 100.

Figure 16:
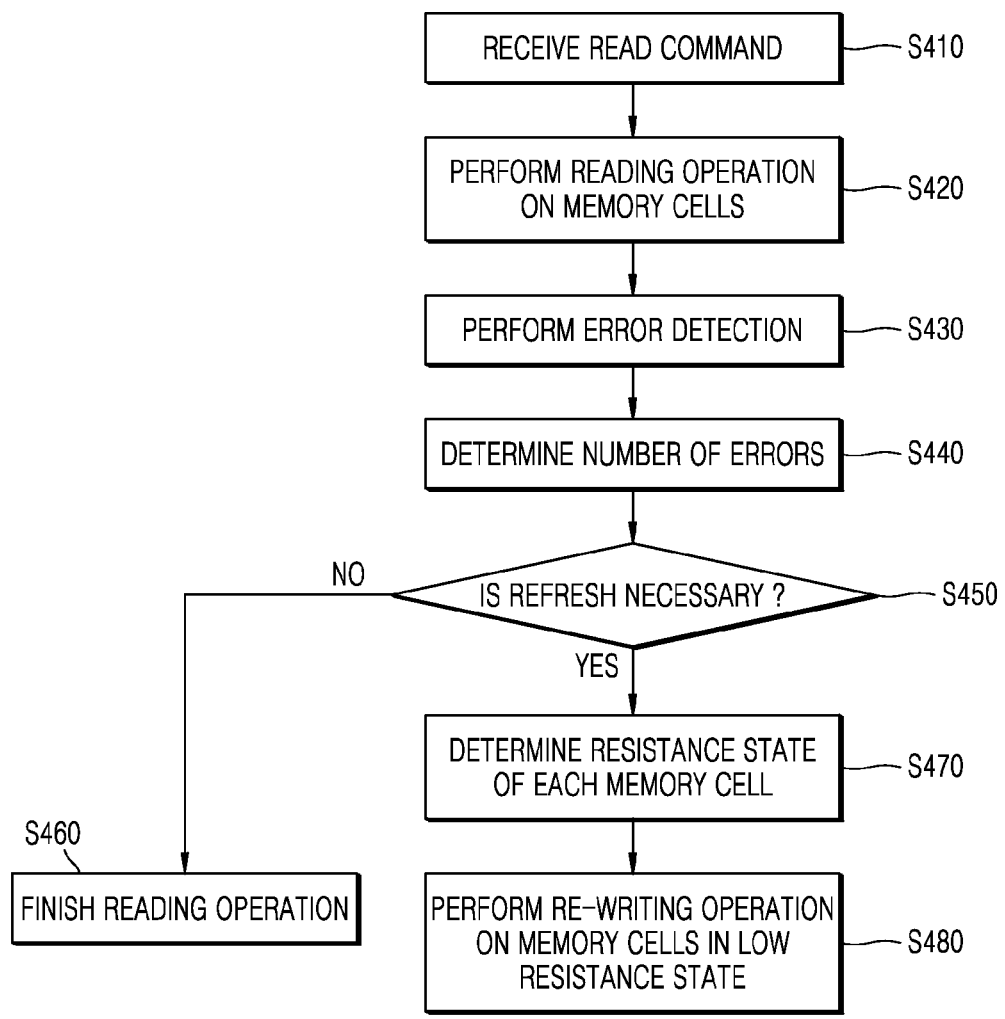
FIG. 16 is a flowchart illustrating an example of the method of operating the memory device of the embodiment of FIG. 13.

Referring to FIG. 16, a read command may be received (S410) after being transmitted from outside. In one exemplary embodiment, the read command and an address indicating the memory cell region that is to be read may be transmitted together.

The reading operation is performed (S420) on the memory cells indicated by the address. The read data may be output to the memory controller, and may be provided to the refresh control unit 131.

An error detection operation may be performed (S430) with respect to the read data in order to verify the read data. According to an error detection result, the number of errors may be determined (S440), for example by determining the number of fail bits.

It may be determined (S450), based on the number of errors detected for example, whether the refresh operation needs to be performed. If the number of errors is equal to or less than a reference value, the reading operation may be finished (S460) without performing an additional refresh operation.

However, if the refresh operation needs to be performed, the resistance state of each of the memory cells is determined (S470) to determine on which memory cells the re-writing operation is to be performed. In this exemplary embodiment, the resistance states of the memory cells are pre-read to determine the read resistance states. In another exemplary embodiment, the resistance states of the memory cells may be determined based on the data read (S420) as discussed above. The memory cells may be classified as being in the low resistance state or in the high resistance state based on the resistance states, and the re-writing operation, for example, the set writing operation, may be performed (S480) on the memory cells in the low resistance state.

Figure 17:
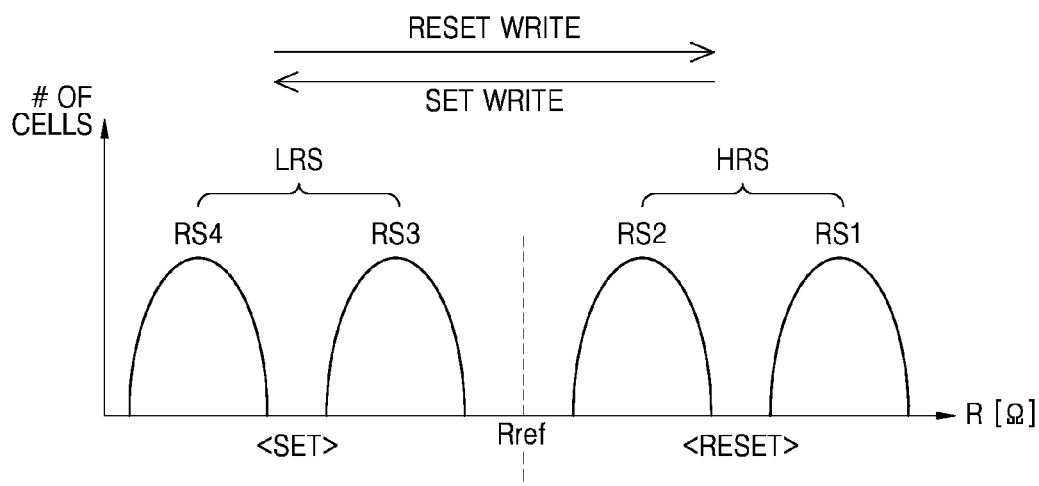
FIG. 17 is a graph illustrating an exemplary distribution of resistance in memory cells.

FIG. 17 illustrates the distribution of the resistance levels of the memory cell MC when the memory cell MC is a multi level cell programmed with two bits. As described above with reference to FIG. 6B, the memory cell MC may have one of the first through fourth resistance states RS1 through RS4.

The resistance states may be classified as in the high resistance state HRS or the low resistance state LRS based on comparison with the critical resistance level Rref. As illustrated, the critical resistance level Rref may be located between the second resistance state RS2 and the third resistance state RS3. Thus, the third resistance state RS3 and the fourth resistance state RS4, which are lower than the critical resistance level Rref, may be referred to as low resistance states LRS. Conversely, the first resistance state RS1 and the second resistance state RS2, which are greater than the critical resistance level Rref, may be referred to as high resistance state HRS. Also, the low resistance state LRS may be referred to as the set state, and the high resistance state HRS may be referred to as the reset state. The memory cells in the low resistance state LRS, that is, the third and fourth resistance states RS3 and RS4, are the memory cells on which the set writing operation is performed, and the memory cells in the high resistance state HRS, that is, the first and second resistance states RS1 and RS2, are the memory cells on which the reset writing operation is performed.

In this exemplary embodiment, when the memory device 100 (FIG. 1) is refreshed, the re-writing operation is performed on the memory cells having the third and fourth resistance states RS3 and RS4, which are low resistance states LRS, and not on the memory cells having the first and second resistance states RS1 and RS2, which are high resistance states HRS.

Figure 18:
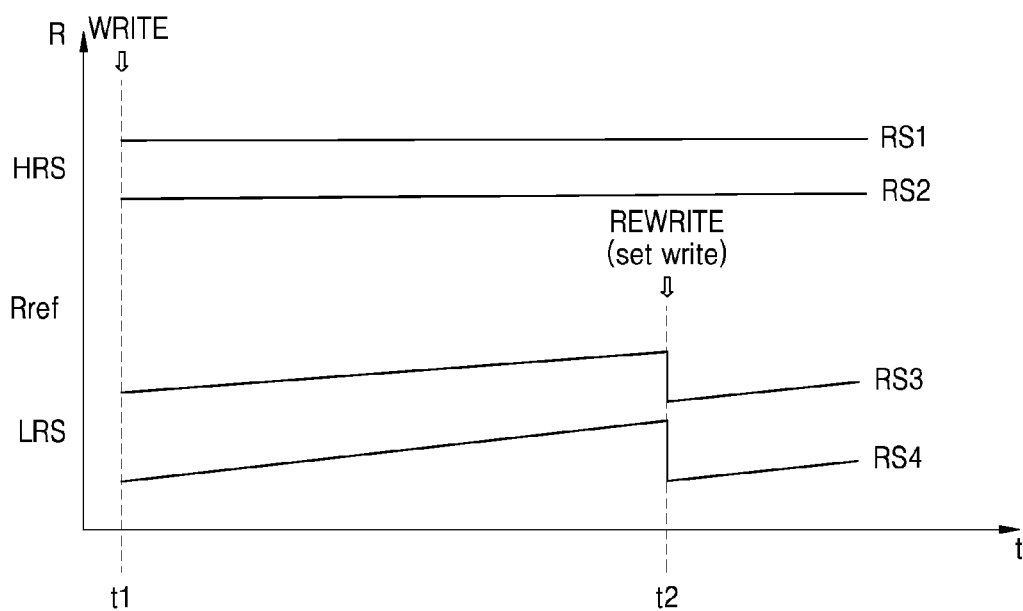
FIG. 18 is a graph illustrating a method of operating a memory device according to another exemplary embodiment of the inventive concept.

FIG. 18 illustrates the method of operating the memory device when the memory cells have the resistance distribution shown in FIG. 17. Referring to FIG. 18, when a writing operation is performed on the memory cells at t1, the memory cells may have one of the plurality of resistance states RS1 through RS4. Here, the memory cells in the high resistance states HRS, for example, the first and second resistance states RS1 and RS2, are the memory cells on which the reset writing operation is performed, and thus may be in the reset states. The memory cells in the low resistance state, for example, the third and fourth resistance states RS3 and RS4, are the memory cells on which the set writing operation is performed, and thus in the set states. Since the memory cells in the low resistance state LRS have poor data retention characteristics, their resistance levels may increase as time has passed. Thus, the memory device 100 (FIG. 1) may determine to perform the refresh operation at t2, and may perform the re-writing operation on the memory cells in the low resistance states LRS to recover the resistance levels. However, resistance levels of the memory cells in the high resistance state HRS do not increase much, and thus the re-writing operation may not be necessary. Accordingly, in this exemplary embodiment the re-writing operation may be selectively performed only on the memory cells in the low resistance state LRS, e.g., the third and fourth resistance states RS3 and RS4.

Figure 19:
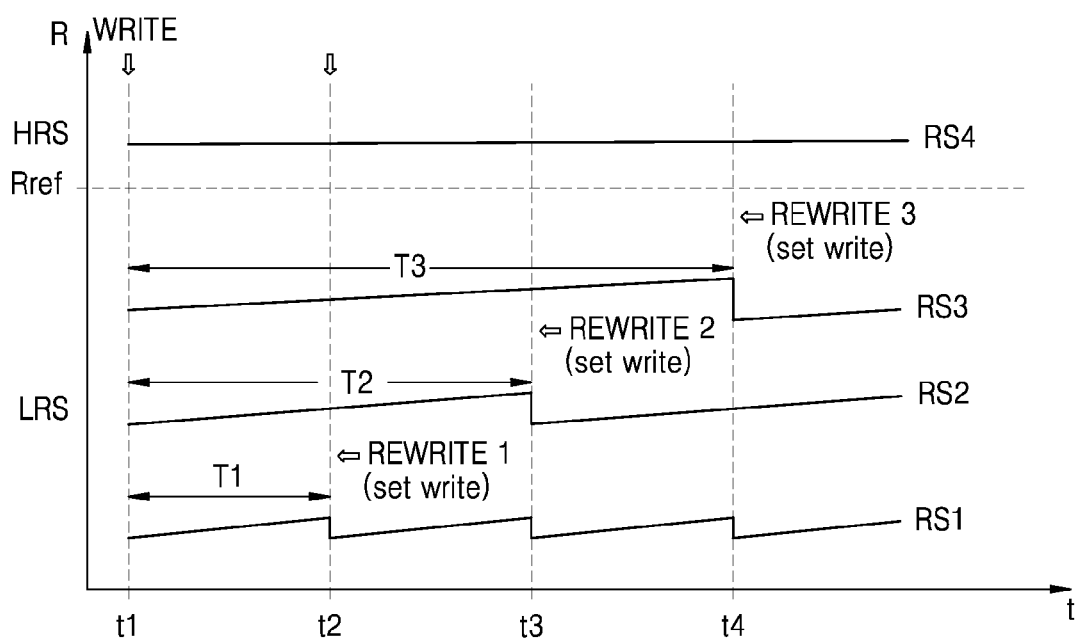
FIG. 19 is a graph illustrating a method of operating a memory device according to another exemplary embodiment of the inventive concept.

FIG. 19 is a graph illustrating a method of operating the memory device according to another exemplary embodiment of the inventive concept. The memory cells may have one of the plurality of resistance states RS1 through RS4, and in this case the resistance states RS1 through RS4 may be classified as high resistance state HRS or low resistance state LRS depending on comparison with the critical resistance level Rref.

In addition, in this exemplary embodiment frequency of the refresh operation may be determined according to the resistance states. For example, in the case of the first resistance state RS1, the refresh operation may be performed at a first refresh period T1 that is the smallest, and thus the frequency of performing the refresh operation may be highest in the first resistance state RS1. In the case of the second resistance state RS2, the refresh operation may be performed at a second refresh period T2 that is longer than the first refresh period T1. In the case of the third resistance state RS3, the refresh operation may be performed at a third refresh period T3 that is longer than the second refresh period T2. In case of the fourth resistance state RS4 that is the high resistance state HRS, the refresh operation may be not performed. As the resistance level of the resistance states lowers, increase in the resistance level according to a time lapse may rise. According to this method of operating the memory device in this exemplary embodiment, the refresh cycle and the refresh frequency may vary depending on the resistance states of the memory cells so that the refresh operation may be performed effectively and the data may be stabilized.

Figure 20:
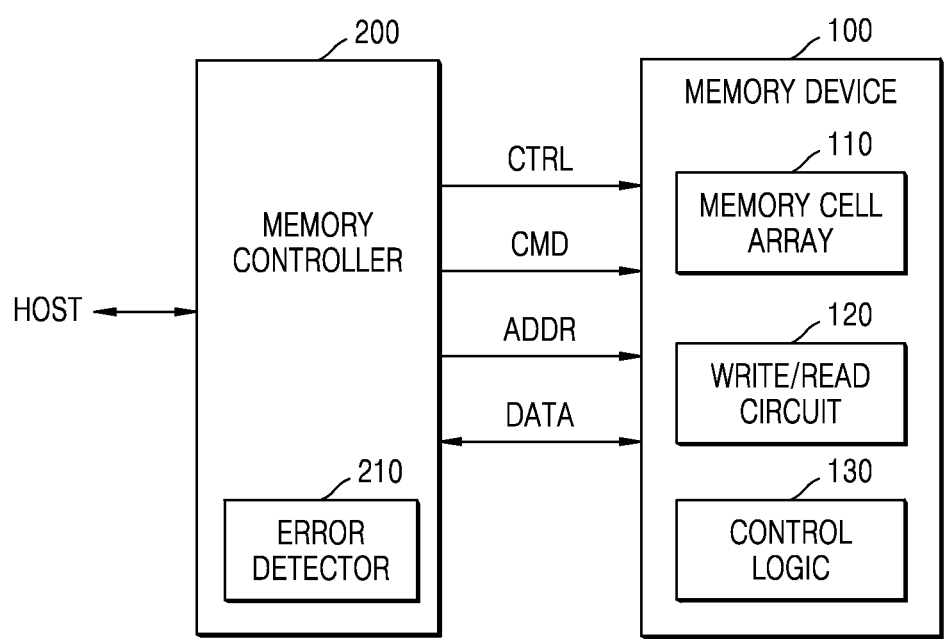
FIG. 20 is a block diagram of a memory system including a resistive memory device according to an exemplary embodiment.

In FIG. 20, a schematic block diagram of a memory system including a resistive memory device according to an exemplary embodiment, components denoted by the same reference numerals as those of FIG. 1 have the same functions as those of FIG. 1, and thus detailed descriptions thereof are omitted.

Referring to FIG. 20, a memory controller 200a may include an error detector 210. The error detector 210 may be, for example, an error correction code (ECC) engine. The error detector 210 performs an error detection operation with respect to the data read from a memory device 100a to determine whether the refresh operation is to be performed. The error detector 210 may transmit a command CMD for performing the refresh operation to the memory device 100a if the number of detected errors is equal to or greater than a predetermined reference value. In addition, the error detector 210 may perform error detection by the cell region unit, and may then transmit to the memory device 100a the command CMD for performing the refresh operation, and an address ADDR indicating the cell region in which the refresh operation is to be performed.

On receiving the command CMD for performing the refresh operation, the memory device 100a may perform the refresh operation on all or some of the memory cells in the memory cell array 110. Here, as described above, the memory device 100a may perform a pre-reading operation of data from the memory cells to determine the resistance states of the memory cells, and then may perform the re-writing operation on the memory cells that are determined to have the low resistance state.

Figure 21:
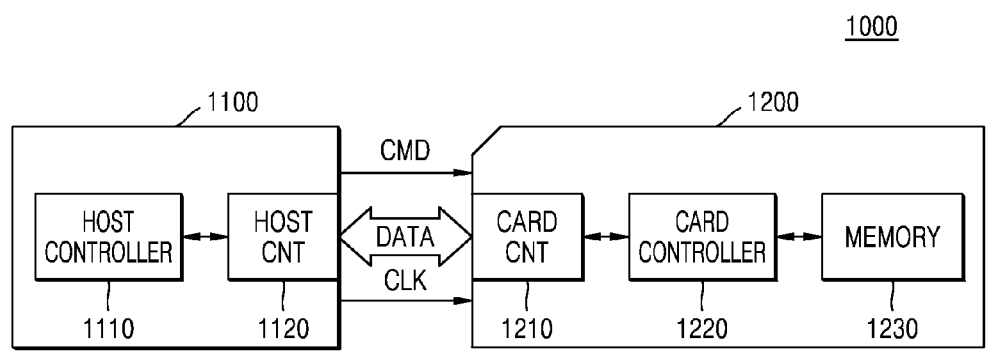
FIG. 21 is a block diagram of a memory card system to which a memory system according to an exemplary embodiment is applied.

FIG. 21 is a block diagram of a memory card system 1000 having a memory system applied thereto in accordance with exemplary embodiments including those of FIGS. 1 through 20.

Referring to FIG. 21, the memory card system 1000 may include a host 1100 and a memory card 1200. The host 1100 may include a host controller 1110 and a host connector 1120. The memory card 1200 may include a card connector 1210, a card controller 1220, and a memory device 1230. The memory card 1200 may be embodied by using the exemplary embodiments of FIGS. 1 through 20.

The host 1100 may write data to the memory 1200 or may read data stored in the memory card 1200. The host controller 1110 may transmit a command CMD, a clock signal CLK generated by a clock generator (not shown) in the host 1100, and data DATA to the memory card 1200 via the host connector 1120.

In response to the command CMD received via the card connector 1210, the card controller 1220 may store the data DATA in the memory device 1230 in synchronization with a clock signal generated by a clock generator (not shown) in the card controller 1220. The memory device 1230 may store the data DATA that is transmitted from the host 1100.

The memory card 1200 may be embodied as a compact flash card (CFC), a microdrive, a smart media card (SMC), a multimedia card (MMC), a Security Digital Card (SDC), a memory stick, or a USB flash memory drive for example.

Figure 22:
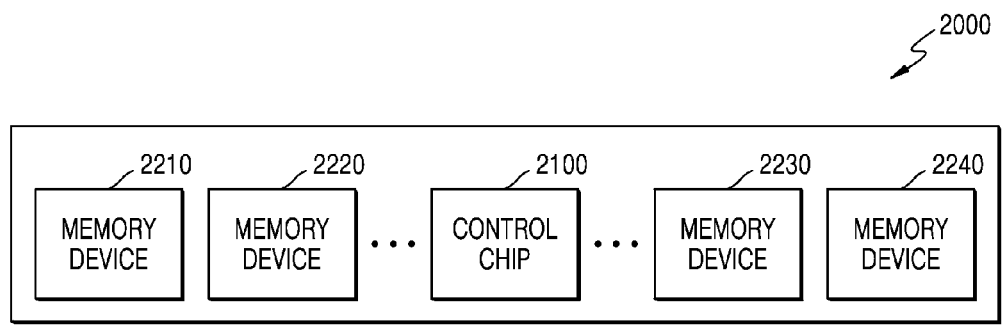
FIG. 22 is a diagram of a resistive memory module according to an exemplary embodiment.

FIG. 22 illustrates a resistive memory module 2000 according to an exemplary embodiment. Referring to FIG. 22, the resistive memory module 2000 may include memory devices 2210 through 2240, and a control chip 2100. Each of the memory devices 2210 through 2240 may be embodied by using the exemplary embodiments of FIGS. 1 through 20. In response to various signals transmitted by an external memory controller, the control chip 2100 may control the memory devices 2210 through 2240. For example, in response to various commands and addresses that are transmitted from an external source, the control chip 2100 may activate the memory devices 2210 through 2240 corresponding to the various commands and addresses and thus may control writing/reading operations. Also, the control chip 2100 may perform various post processing operations on read data output from each of the memory devices 2210 through 2240, e.g., the control chip 2100 may perform error detection and correction operations on the read data.

In this exemplary embodiment, the memory devices 2210 through 2240 determine the resistance states of the memory cells and perform the re-writing operation selectively on the memory cells in the low resistance or reset state to perform the refresh operation effectively.

Figure 23:
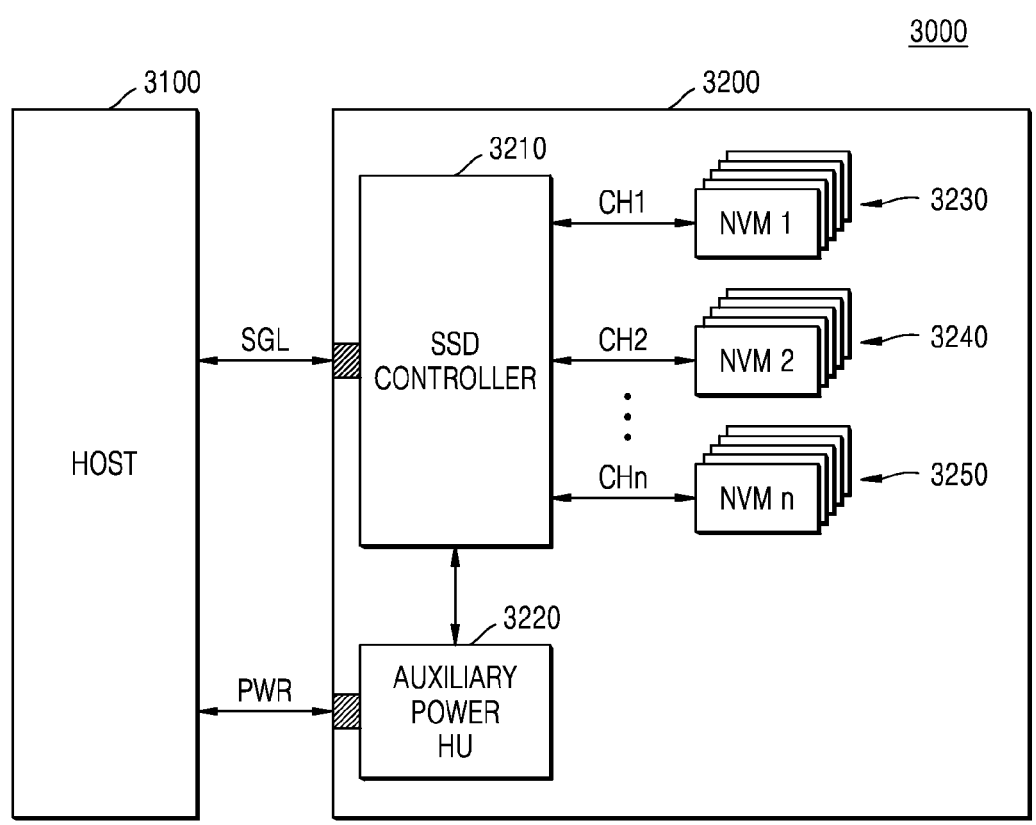
FIG. 23 is a block diagram of a solid state disk (SSD) system to which a memory system according to an exemplary embodiment is applied.

FIG. 23 is a block diagram of a solid state disk (SSD) system 3000 including a memory system applied thereto, according to an exemplary embodiment.

Referring to FIG. 23, the SSD system 3000 may include a host 3100 and an SSD 3200. The SSD 3200 exchanges signals with the host 3100 via a signal connector, and may receive a power input from a power connector. The SSD 3200 includes an SSD controller 3210, an auxiliary power device 3220, and a plurality of memory devices 3230, 3240, 3250. The SSD 3200 may be embodied by using the exemplary embodiments of FIGS. 1 through 20.

Figure 24:
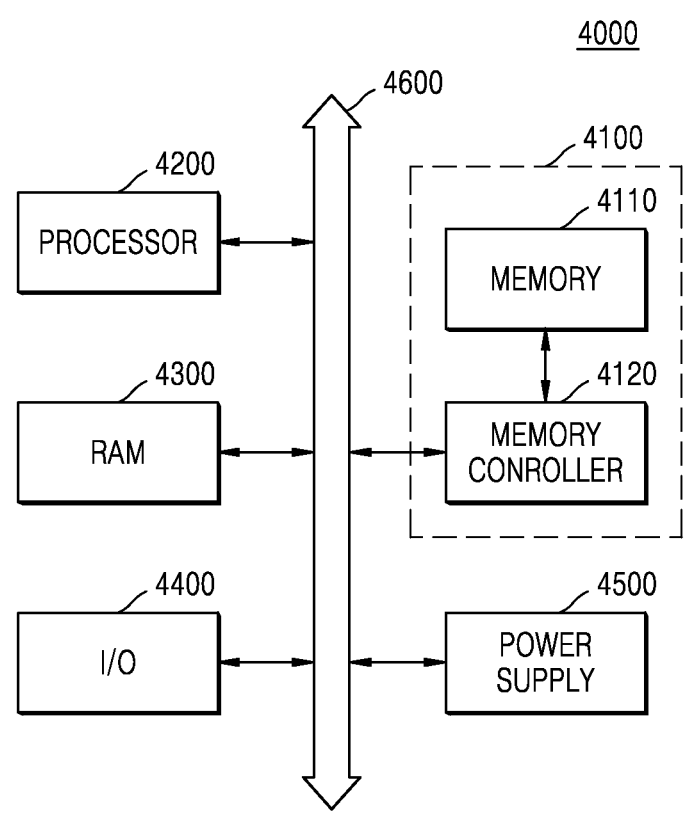
FIG. 24 is a block diagram of a computing system including a memory system according to an exemplary embodiment.

FIG. 24 is a block diagram of a computing system 4000 including a memory system according to an exemplary embodiment.

Referring to FIG. 24, the computing system 4000 may include a memory system 4100, a processor 4200, a RAM 4300, an input/output (I/O) device 4400, and a power supply device 4500. Although not illustrated in FIG. 24, the computing system 4000 may further include ports capable of communicating with a video card, a sound card, a memory card, or a USB device, or other electronic devices. The computing system 4000 may be embodied as a PC, a portable electronic device such as a notebook computer, a mobile phone, a personal digital assistant (PDA), or a camera.

The processor 4200 may perform particular calculations or tasks. In one or more exemplary embodiments, the processor 4200 may be a micro-processor or a Central Processing Unit (CPU). The processor 4200 may perform communication with the RAM 4300, the I/O device 4400, and the memory system 4100 via a bus 4600 such as an address bus, a control bus, or a data bus. Here, the memory system 4100 may be embodied by using the exemplary embodiments of FIGS. 1 through 20.

In one or more exemplary embodiments, the processor 4200 may also be connected to an extended bus such as a Peripheral Component Interconnect (PCI) bus.

The RAM 4300 may store data for operations of the computing system 4000. As described above, the memory device according to the one or more exemplary embodiments of the inventive concept may be applied to the RAM 4300. Alternatively, a DRAM, a mobile DRAM, an SRAM, a PRAM, an FRAM, or an MRAM may be used as the RAM 4300.

The I/O device 4400 may include an input unit such as a keyboard, a keypad, or a mouse, and an output unit such as a printer or a display. The power supply device 4500 may supply an operating voltage for the operations of the computing system 4000.

While the inventive concept has been particularly shown and described with reference to exemplary exemplary embodiments thereof, it will be understood that various changes in form and details may be made therein without departing from the spirit and scope of the following claims.

What is claimed is:

1. A method of operating a resistive memory device, the method comprising:
    determining whether to perform a refresh operation on memory cells in a memory cell array;
    determining a respective resistance state of each of the memory cells, when the refresh operation is determined to be performed;
    classifying the memory cells within the memory cell array as first memory cells having a resistance state that is equal to or less than a critical resistance level and second memory cells having a resistance state that is greater than the critical resistance level; and
    performing a re-writing operation on the first memory cells among the memory cells.

2. The method of claim 1, wherein the re-writing operation comprises a set writing operation but not a reset writing operation.

3. The method of claim 1, wherein the re-writing operation comprises applying a current pulse to each of the first memory cells.

4. The method of claim 1, wherein the first memory cells have a resistance state other than an uppermost resistance state from among a plurality of resistance states.

5. The method of claim 1, further comprising performing a pre-reading operation on some of the memory cells.

6. The method of claim 1, further comprising:
    writing data to the first memory cells through a set writing operation; and
    writing data to the second memory cells through a reset writing operation.

7. The method of claim 1, wherein when the data is written in the memory cells, a bias voltage is applied to each of the first memory cells so that a filament is generated in a variable resistance device in the first memory cell, and a bias voltage is applied to each of the second memory cells so that a filament in a variable resistance device in the second memory cell is cut.

8. The method of claim 1, wherein the refresh operation is determined to be performed when a first reference time that is set in advance has passed after writing data in the memory cells.

9. The method of claim 1, wherein the determining of whether to perform the refresh operation comprises:
    increasing a counting value representing a number of reading operations, when receiving a read command; and
    determining whether the counting value has reached a reference value, wherein
    if the counting value reaches the reference value, it is determined to perform the refresh operation.

10. The method of claim 1, wherein the determining of whether to perform the refresh operation comprises:
    reading data written in the memory cells;
    performing error detection with respect to the read data; and
    determining whether a number of detected errors in the read data exceeds a reference value that is set in advance, wherein
    if the number of detected errors exceeds the reference value, it is determined to perform the refresh operation.

11. The method of claim 1, wherein the memory cell array comprises a plurality of cell regions, and the performing of the re-writing operation is performed by a cell region unit.

12. A method of operating a resistive memory device comprising a plurality of memory cells each having a respective resistance state that is one of a plurality of resistance states including first and second groups of one or more resistance states, the first group of resistance states having a higher resistance level than the second group of resistance states, the method comprising:
    reading the resistance states of the plurality of memory cells; and
    re-writing the read resistance states to the plurality of memory cells, wherein
    a frequency of performing the re-writing on those of the memory cells having resistance states of the first group of resistance states is less than a frequency of performing the re-writing on those of the memory cells having resistance states of the second group of resistance states.

13. The method of claim 12, wherein the plurality of resistance states comprises a first resistance state having a first resistance level and a second resistance state having a second resistance level lower than the first resistance level, and the re-writing is performed on a memory cell having a third resistance state having a third resistance level that is between the first and second resistance levels.

14. The method of claim 12, wherein the re-writing is not performed on a memory cell having an uppermost resistance state of the plurality of resistance states.

15. A memory system including a resistive memory device, the memory system comprising:
    a memory cell array;
    a write/read circuit; and
    control logic circuitry, wherein the control logic circuitry is configured to:
        determine whether to perform a refresh operation on memory cells in the memory cell array;
        determine a respective resistance state of each of the memory cells, when the refresh operation is determined to be performed;
        classify the memory cells within the memory cell array as first memory cells having resistance states that are determined to be equal to or less than a critical resistance level and second memory cells having resistance states that are determined to be greater than the critical resistance level; and
        instruct the write/read circuit to perform a re-writing operation on the first memory cells among the memory cells.

16. The memory system of claim 15, wherein the re-writing operation comprises a set writing operation but not a reset writing operation.

17. The memory system of claim 15, wherein the re-writing operation comprises applying a current pulse to each of the first memory cells.

18. The memory system of claim 15, wherein each of the first memory cells has a resistance state other than an uppermost resistance state from among a plurality of resistance states.

19. The memory system of claim 15, wherein the control logic circuitry is configured to instruct the write/read circuit to perform a pre-reading operation on some of the memory cells.

* * * * *